United States Patent [19]

Hogerton et al.

[11] Patent Number: 5,714,252
[45] Date of Patent: Feb. 3, 1998

[54] DEFORMABLE SUBSTRATE ASSEMBLY FOR ADHESIVELY BONDED ELECTRONIC DEVICE

[75] Inventors: Peter B. Hogerton, White Bear Lake; Kenneth E. Carlson, St. Paul, both of Minn.

[73] Assignee: Minnesota Mining and Manufacturing Company, St. Paul, Minn.

[21] Appl. No.: 778,112

[22] Filed: Jan. 2, 1997

Related U.S. Application Data

[63] Continuation of Ser. No. 521,134, Aug. 29, 1995, abandoned.

[51] Int. Cl.$^6$ .............. B32B 7/12; B32B 3/00; H05K 3/00; H05K 3/30
[52] U.S. Cl. .............. 428/344; 428/209; 428/901; 29/829; 29/832; 174/255; 174/257; 174/259; 174/260; 361/762; 361/767; 361/779
[58] Field of Search .............. 428/209, 344, 428/901; 29/829, 832; 174/255, 257, 259, 260; 361/762, 767, 779

[56] References Cited

U.S. PATENT DOCUMENTS

| | | | |
|---|---|---|---|
| 4,164,811 | 8/1979 | Heywang | 29/628 |
| 4,643,935 | 2/1987 | McNeal et al. | 428/157 |
| 4,744,850 | 5/1988 | Imano et al. | 156/265 |
| 4,749,120 | 6/1988 | Hatada | 228/123 |
| 5,001,542 | 3/1991 | Tsukagoshi et al. | 357/68 |
| 5,074,947 | 12/1991 | Estes et al. | 156/307.3 |
| 5,120,665 | 6/1992 | Tsukagoshi et al. | 437/8 |
| 5,237,130 | 8/1993 | Kulesza et al. | 174/260 |
| 5,258,577 | 11/1993 | Clements | 174/88 R |
| 5,261,156 | 11/1993 | Mase et al. | 29/832 |
| 5,270,260 | 12/1993 | Scheuenpflug | 437/209 |

FOREIGN PATENT DOCUMENTS

| | | | |
|---|---|---|---|
| 0 337 445 | 10/1989 | European Pat. Off. | C23C 14/20 |
| 0 446 666 | 9/1991 | European Pat. Off. | H01L 21/58 |

OTHER PUBLICATIONS

*Microelectronics Packaging Handbook* (Van Nostrand Reinhold, 1989), R.R. Tummala and E.J. Rymaszewski, pp. 280–309; 366–391.

"Achieving COG technique for multi-terminal LSI started with liquid crystal display pocket-size television," *Nikkei Microdevices*, K. Nakamura, Jun. 1987.

*Primary Examiner*—Cathy F. Lam
*Attorney, Agent, or Firm*—H. Sanders Gwin, Jr.

[57] ABSTRACT

The present invention relates to a deformable substrate assembly for microelectronic components which includes an array of ductile metal circuit traces on a surface thereof. When an electronic component is adhesively bonded to the substrate assembly, and bonding elements from the component contact the traces, the substrate has material properties which allow individual bonding elements to locally deform the traces until the traces penetrate into the substrate surface.

12 Claims, 38 Drawing Sheets

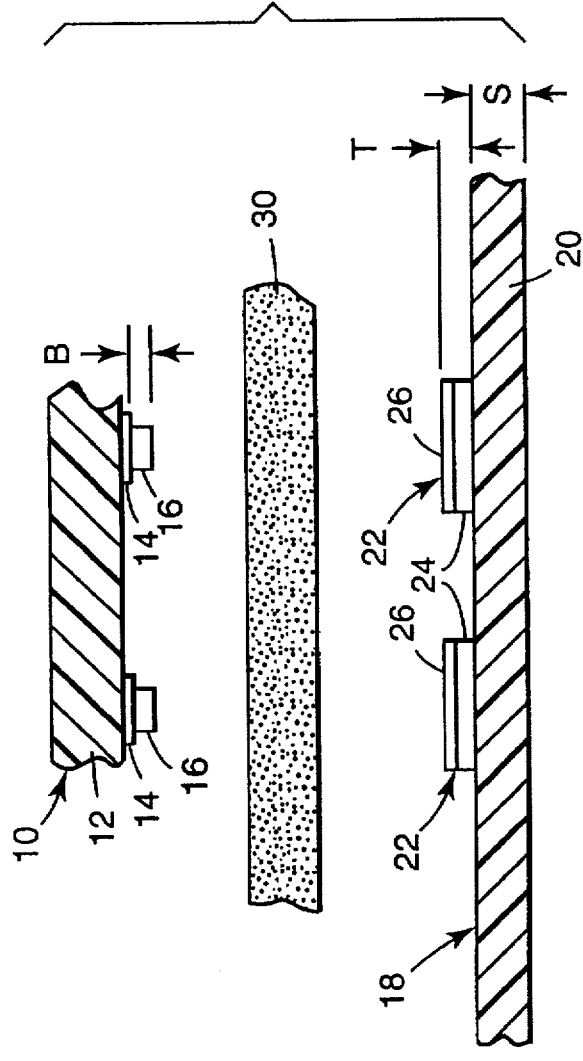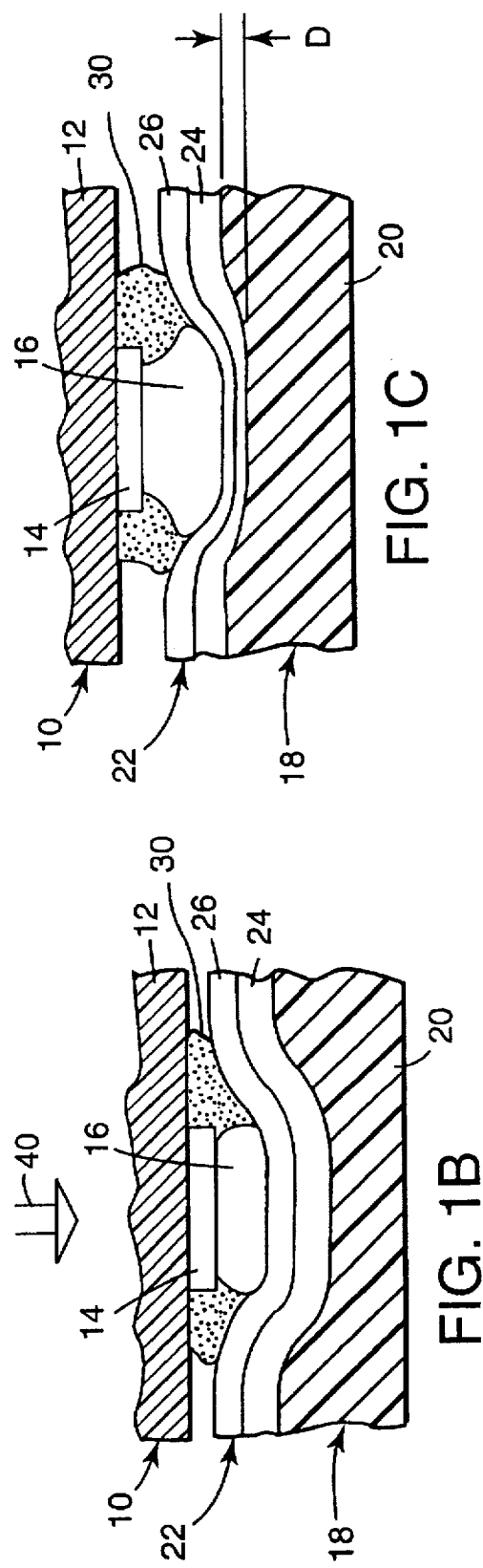

DEFORMABLE SUBSTRATE ASSEMBLY FOR ADHESIVELY BONDED ELECTRONIC DEVICE

This is a continuation of application Ser. No. 08/521,134 filed Aug. 29, 1995, now abandoned.

BACKGROUND OF THE INVENTION

1. Field of the Invention

The present invention relates to microelectronic assemblies and methods for their manufacture. More particularly, the present invention relates to a microelectronic assembly in which a microelectronic component is adhesively attached to a substrate assembly, and a bonding site on the component is electrically connected to a corresponding bonding site on the substrate assembly. Even more particularly, the present invention relates to a deformable substrate assembly for microelectronic components which includes an array of ductile metal circuit traces on a surface thereof. When an electronic component is adhesively bonded to the substrate assembly, and bonding elements from the component contact the traces, the substrate has material properties which flow individual bonding elements to locally deform the traces until the traces penetrate into the substrate surface.

2. Description of Related Art

A significant ongoing problem in the microelectronic art is the continuing challenge of packing more integrated circuit devices with their associated interconnection circuitry into less space to form assemblies that are reliable in ever more demanding end use environments. This increased device density requires thinner circuit traces on the substrate which are packed ever closer together (high pitches). The demand for higher information flow rates also requires higher signal frequencies. To accommodate these needs, Flipped Direct Chip Attachment (FDCA) is used to attach a chip directly to a circuit board, and provide the shortest attainable path length between components, thus minimizing signal propagation delays at high frequency.

The most common attachment means used in FDCA is solder bump/flip-chip interconnection. A conventional technique for solder bump/flip chip The most common attachment means used in FDCA is solder bump/flip-chip interconnection. A conventional technique for solder bump/flip chip interconnection is Controlled Collapse Chip Connection ("C4"), in which metallurgical solder joints provide both the mechanical and electrical interconnections between the chip and the substrate. With C4 techniques reliable electrical interconnections may only be achieved for a limited number of substrate materials and chip designs. Further, the shape and height of the reflowed solder joints, which are critical to reliable performance, require use of an elaborate, expensive, and process intensive Pad Layer Metallurgy (PLM) process. The C4 process has inherent pitch limitations, and cannot accommodate substrate imperfections such as flatness and warpage. Mismatched coefficients of thermal expansion (CTE) between the chip and the substrate result in high shear stresses in the reflowed solder interconnections in the C4 process, which can compromise the reliability of the interconnections. See, R. R. Tummala and E. J. Kymaszewski, Microelectronics Packaging Handbook (Van Norstrand Reinhold, 1989), pp. 280–309; 366–391; and K. Nakamura, Nikkei Microdevices, June 1987. Catastrophic failure is the immediate result of any cracking that occurs in the solder joints as a reaction to these high shear stresses. The inherent deficiencies in solder bump bonding have created a need in the art for an alternate means of reliable interconnection for FDCA and other applications.

One method involves the use of a heat-bondable adhesive, which may or may not be curable, to provide an intimate mechanical flip-chip bond, and to provide pressure engaged, rather than metallurgical, electrical interconnections to the substrate. Conductive particles within the adhesive, or alternately, metallic bumps on the chip itself, provide the electrical interconnection media for this method. Thermal and/or cure shrinkage stresses in the media are required to establish the pressure engaged contacts.

In an adhesive bonding process described in FIGS. 1A and 1B of U.S. Pat. No. 4,749,120 to Hatada, metallic bonding sites 14, referred to as bumps, on an electronic device 10 are electrically connected to a circuit wiring pattern 20 on a wiring board 16 by: (1) dispensing an insulating adhesive resin 22 between the bumped device 10 and the board 16; (2) aligning the bumps 14 on the device with corresponding bonding sites on the wiring pattern 20; (3) applying pressure with tool 24 so that the bumps 14 and the wiring pattern 20 are pressed together; (4) applying either light or heat 28 to stiffen the insulating resin 22; and (5) removing pressure after the resin 22 has stiffened.

In an alternate embodiment shown in FIG. 2 of the '120 patent to Hatada, a soft, low melting point metal 30 is applied between the bumps 14 and the wiring pattern 20. If the device 10 is exposed to extreme temperatures or mechanical forces, the Hatada patent states in col. 4, lines 49–58, that the metal 30 may act as an absorber to maintain the electrical connection between the bumps 14 and the wiring board 16.

The Hatada processes rely on adhesive shrinkage, not solder reflow, to establish the electrical connection between the bumps and the circuitry on the wiring board. The adhesive bonding procedure thus provides the potential for fine pitch connections and eliminates many of the difficulties associated with the C4 process. The shrinkage of the adhesive creates pressure engaged connections which are subject to less stress than those prepared from reflowed solder. In addition, the adhesive encapsulates the connections and provides protection from environmental and mechanical stress.

Unfortunately, the elimination of the solder reflow step provides no mechanism to accommodate imperfections in bump height variability, trace height variability on the substrate, substrate warp age and non-uniformity in bond pressure distribution. Hatada states in col. 1 of the '120 patent that imperfections, such as lack of circuit board flatness, can compromise the reliability of the solder connections in the C4 process. Considering the rigid, high modulus materials (glass, ceramic, resin or a metal, see col. 3, lines 37–41 of Hatada) used as substrates in his processes, and the metals having relatively low yield stresses (Au, Ag, Cu, solder) which are used as bump materials, it is clear that plastic deformation of the bumps must compensate for such imperfections and preserve the reliability of the electrical connection. However, plastic deformation of the bumps often requires unacceptably high bonding force requirements. In addition, accelerated reliability tests indicate that the pressure engaged connections described in Hatada typically have a limited ability to accommodate relaxations and strains in the adhesive matrix. If high density arrays of integrated circuit devices are to be reliably electrically connected to circuit structures, an adhesively bonded circuit assembly must be engineered to accommodate variations in bump height and bond pressure across the bond area while allowing a reduction in bonding forces.

SUMMARY OF THE INVENTION

The present invention relates to electrical "flip-chip" connections in which an unpackaged electronic device, such as an integrated circuit device (IC), is mounted face down, directly onto a circuit structure applied on a surface of a deformable substrate. The electrical connection between a bonding element on the IC and the circuit structure is established and maintained with an adhesive composition. The present inventors have discovered that deleterious effects on the electrical connection in an adhesively bonded circuit assembly caused by variability in the height of the bonding elements on the IC, variability of the height of the circuit structure on the substrate, substrate warpage, and non-uniformity in pressure distribution during the IC to circuit structure bonding process may be minimized by providing a circuit substrate material that is locally deformable where the IC bonding element contacts the circuit structure on the substrate.

In one aspect, the present invention provides a substrate assembly for mounting adhesively bonded microelectronic devices which includes a deformable substrate with ductile metal circuit traces on a surface thereof. During the adhesive bonding operation, as the bonding elements on the IC device contact the traces, the substrate of the invention has material properties which allow individual bonding elements to locally deform the traces until the interconnected elements and traces penetrate a predetermined distance into the substrate surface. This localized deformation in the substrate creates a "wiping action" between the IC bonding element and the circuit trace which results in the formation of an intimate and high integrity electrical contact between them. In addition, the deformation in the substrate accommodates variations in height of the bonding elements and bond pressure across the bond areas without generating undue stresses in the materials surrounding the electrical contacts.

The material from which the substrate of the invention is made must be locally deformable at the bonding temperature such that the circuit traces which have been deformed by the bonding elements penetrate into its surface a distance sufficient to form a reliable electrical connection between the elements and the traces. Preferably, the deformable substrate of the invention is made of a polymeric material which has a glass transition temperature ($T_g$) below the temperature in which the adhesive used to bond the assembly is processed (referred to herein as the "bonding temperature"). In addition, it is preferred that the compressive yield strength at the bonding temperature of the polymeric material from which the substrate is made be lower than the yield stress of the bonding elements on the IC at the bonding temperature. This allows a high integrity bond to be established with lower bonding forces than those required for the rigid substrates described in the prior art.

The patterned circuit traces disposed on a surface of the substrate must be made of a ductile metallic material with a thickness sufficient to permit small-scale/localized plastic deformation at the bonding temperature without tearing. These material properties permit the IC bonding element to initially locally deform the traces and then press portions of them into the surface of the substrate during the bonding procedure.

In another aspect, the present invention provides an adhesively bonded microelectronic circuit assembly which has exceptionally stable and reliable electrical interconnections between the IC and the substrate assembly described above.

The invention extends to a method of making the bonded microelectronic circuit assembly. In the method of the invention, a stack-like construction is prepared which includes an electronic device with metal bonding sites, a substrate assembly of the invention, and an adhesive. The metal bonding sites are aligned with the patterned circuit traces on the substrate assembly and the adhesive is stiffened by an appropriate method known in the art. A bonding force is applied to the stack to press the bonding sites into electrical contact with the circuit traces so that the traces extend a predetermined distance into the surface of the substrate.

The deformable substrate assembly of the invention permits formation of highly reliable flip-chip connections at lower bonding forces than those required for conventional rigid substrates. In addition, the deformable nature of the substrate materials used in the invention accommodates variations in IC bonding sites and circuit structures without formation of localized stress areas that may compromise electrical connection following repeated relaxations and strains in the adhesive matrix between the IC and the substrate.

BRIEF DESCRIPTION OF THE DRAWINGS

FIG. 1A is a diagrammatic sectional view of the components used in the process of the present invention;

FIG. 1B is a diagrammatic sectional view of the process of the invention showing an interconnection between an IC bump and a circuit trace on a substrate assembly of the invention;

FIG. 1C is a diagrammatic sectional view of the process of the invention showing a completed bond between an IC bump and a circuit trace on a substrate assembly of the invention;

DETAILED DESCRIPTION OF THE PREFERRED EMBODIMENTS

Figure 2A:
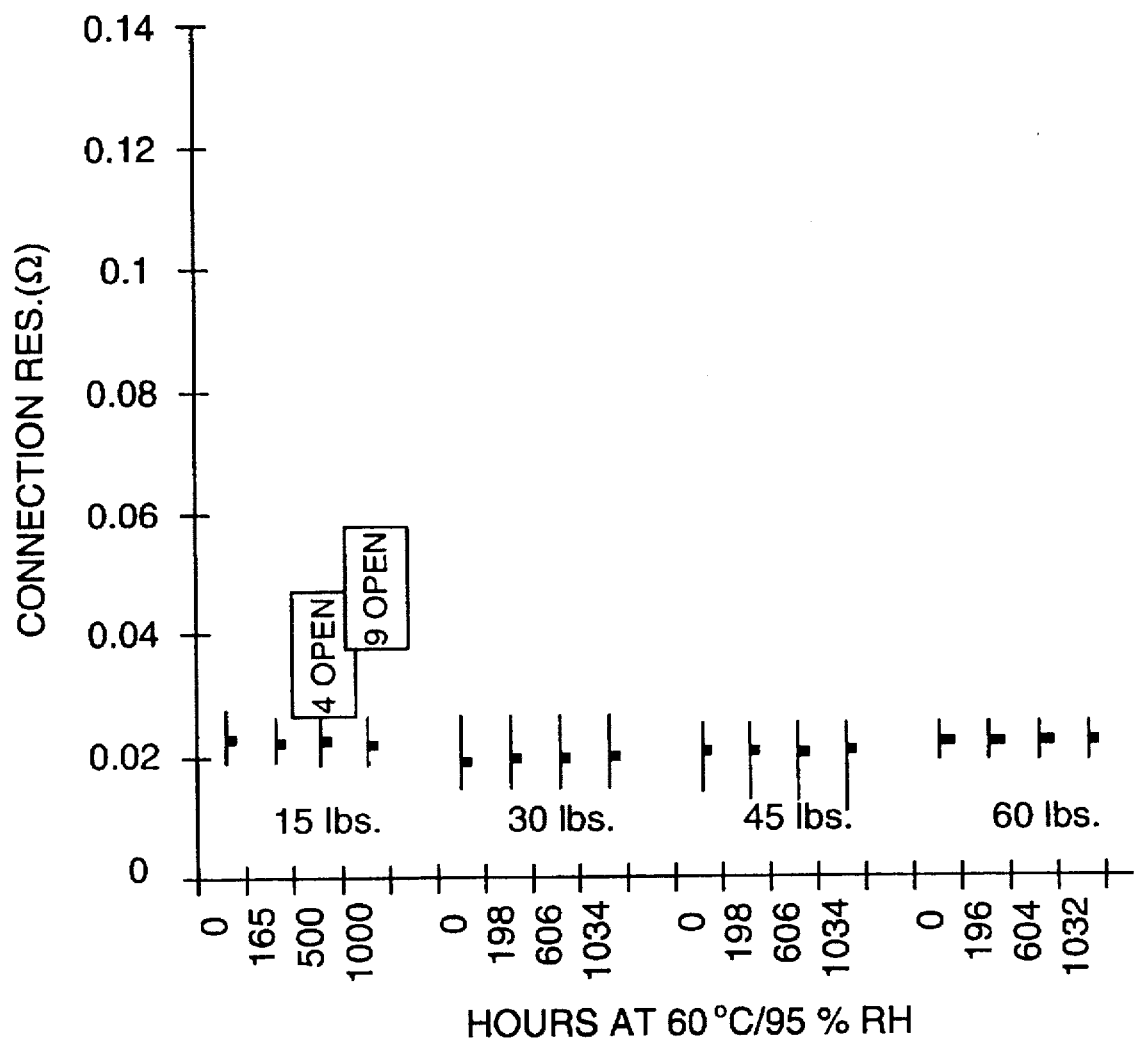
FIG. 2A is a plot showing the results of the environmental testing of the electronic circuit assemblies prepared in Example 1.

In an embodiment of a microelectronic circuit assembly of the invention illustrated in FIG. 1, an integrated circuit device (e.g., an IC chip) 10 is shown which includes a silicon base 12 having at least one electrode pad 14 attached thereto. The electrode pad 14 is typically constructed from a multilayer metallic film made of aluminum, chromium, copper or like metallic materials. At least one metal bonding element 16, referred to herein as a bump, is attached to the electrode pad 14 and extends outward beyond a surface thereof a distance B (referred to in the present application as the "bump height," which ranges from about 3 to about 40 µm) to provide an electrical connection to the IC chip 10. The metal bump is normally made of a metallic material such as, for example, gold, silver, copper, solder, and compatible alloys thereof. The electrode pad 14 and the bumps 16 are applied to the base 12 using well-known photolithographic and electroplating methods which will not be further discussed here.

A deformable substrate assembly 18 of the invention includes a substrate 20 of thickness S with a circuit pattern 22 on a surface thereof. The circuit pattern 22 consists of an arrangement of ductile metal traces of total thickness T. The traces may consist of a single base layer 24 of copper, silver, gold, aluminum, solder and the like which is applied directly to the substrate. Optionally, an additional surface layer 26, usually of gold, may be electroplated onto the base layer 24 to prevent oxidation of the base layer 24. The surface layer 26 is preferably matched to the metal of the bump 16 on the IC to promote formation a fusion bond between identical metals. In the present application the total thickness T refers to the combined thickness of the base layer 24 and the additional surface layer 26, if any.

An insulating adhesive material 30 is positioned between the IC 10 and the substrate assembly 18. The adhesive may be disposed on a bottom surface of the IC, or may be provided on the surface of the substrate assembly 18 atop the circuit pattern 22. The adhesive 30 may be a liquid or a sheet material, and may be stiffened by chemical crosslinking induced by means well known in the art.

As shown in FIG. 1B, after alignment of bumps 16 with the circuit traces 22, downward pressure is applied to the IC 10 in the direction of the arrow 40. As the bump 16 contacts the circuit traces 22, the adhesive 30 is pushed outwardly and is substantially removed from the area between the metal bump 16 and the circuit traces 22. The adhesive is then stiffened by any appropriate means, such as, for example, by application of heat. At the bonding temperature, the substrate 20 becomes locally deformable in the region beneath each interconnected bump 16 and trace 22. The pressure applied to the IC 10 causes the bump 16 to press on the bonding element, the ductile trace 22 deforms, and the deformed trace 22 penetrates into the surface of the substrate 20. Upon deformation of the trace 22, a portion of the bump 16 may also be below the surface of the substrate 20.

As shown in FIG. 1C, the trace 22 deforms by simultaneously bending and stretching as it contacts the edges of the bump 16 and moves upward and around the bump on its external periphery. While not wishing to be bound by any theory, it is believed that deformation of the trace 22 provides a localized "wiping action" which removes oxidation from the external periphery of the bump. The deformation of the trace 22 also increases the contact area between the trace 22 and the bump 16 to enhance the quality and reliability of the electrical connection. Depending on the contact force applied between the IC and the substrate, the deformation of the trace 22 may also slightly deform the periphery of the bump 16, which may further enhance the quality of the electrical connection. The interconnected bump 16 and trace 22 eventually penetrates into the surface of the substrate 20 a predetermined distance D to ensure that a reliable electrical connection is established between the IC and the circuit structure.

There is a complex and difficult-to-formulate interrelationship of variables that quantitatively describes the deformation of the ductile metal circuit traces as they are bent and stretched around the periphery of the bumps. While not wishing to be bound by a specific theory, the present inventors believe that for a bump/trace interface with a known geometry, a specified level of bonding force, and a given adhesive, important variables include the composition of the substrate and the thickness of the traces.

The substrate 20 of the invention may be made of any material that is sufficiently deformable at the bonding temperature to allow the interconnected traces 22 and/or bump 16 to penetrate a predetermined distance below its surface during the bonding procedure to form a reliable electrical connection. The bonding temperature in the present invention may be any temperature that does not damage the IC to be bonded to the substrate, and generally ranges from about 50° C. to about 200° C. Preferably, the bonding temperature is about 70° C. to about 180° C., most preferably about 130° C. to about 160° C.

The substrate is preferably made of a deformable polymeric material. The polymers useful as the substrates in the present invention have a glass transition temperature ($T_g$) below the bonding temperature. "Glass Transition Temperature ($T_g$)" as used herein is defined as the temperature (actually a narrow range of temperatures) at which a second order phase transition occurs in amorphous polymers. Above $T_g$ the polymers are soft, flexible, rubbery materials, and below $T_g$ they are conversely hard, rigid plastics that behave like glass. The unknown $T_g$ of a given amorphous polymer can be determined using a variety of methods, and differential scanning calorimetry (DSC) is preferred.

Preferred substrate polymers are those having $T_g$s slightly below the bonding temperature. Examples of suitable deformable polymers include, but are not limited to, poly (ethylene-terephthalate) (PET, $T_g$=about 342K), poly (ethylene 1,4 napthanate), (1,4-PEN, $T_g$=about 337K), poly (ethylene 1,5 napthanate) (1,5-PEN, $T_g$=about 344K), poly (ethylene 2,6-napthanate) (2,6-PEN, $T_g$=about 386 K), poly (ethylene 2,7-napthanate) (2,7-PEN, $T_g$=about 392K), and syndiotaticpoly(styrene). A particularly preferred substrate material is PET, which is generally understood to have a $T_g$ of about 342K in the amorphous state. If supplied in the form of a crystalline, oriented film, the $T_g$ of PET may be as high as about 398K.

Alternatively, "deformable" as used herein describes a polymer which, at the bonding temperature, is sufficiently flowable to permit the deformed circuit trace to penetrate at least about 1–2 µm, preferably about 2–5 µm, into the substrate surface (see distance D in FIG. 1C). Normally, the substrate is supplied as a polymer film which has a thickness (see S in FIG. 1A) of about 10 µm to about 100 µm, preferably about 10 µm to about 50 µm, and material making up the film should permit the trace to penetrate a distance D/S of at least about 5% of the substrate thickness. If the height of the bump (see B in FIG. 1A) is considered, the material making up the substrate should allow the trace to penetrate a distance D/B of at least about 3% to about 5% of the bump height.

The polymer making up the substrate of the invention should have a compressive yield strength at the bonding temperature that is less than the pressure transmitted though the circuit trace by the interconnected bumps and traces during the bonding procedure. This parameter is a measure of how easily the polymer yields and is able to flow around, and away from, the advancing interconnected traces and bumps. The compressive yield strength of PET film is generally reported to be about 8,000 to about 2,000 PSI (55–140 Megapascals) at room temperature. However, compressive yield strengths are difficult to measure for the oriented, crystalline, chemically cross-linked, or fiber-reinforced polymers which may be used as circuit substrates in the present invention. In such cases, polymer compressive strength (as measured using ASTM-695, in which the temperature is specified as 23°C.±2° C.) may serve as a rough indicator of compressive yield strength. The deformable substrates useful in the invention have compressive yield strengths at room temperature of less than about 175 Megapascals (MPa), preferably less than about 125 MPa as measured using ASTM-695.

The polymers used in the present invention may optionally contain a small amount of fillers, such as powders, pigments, flakes, chopped fibers, and the like, at concentrations sufficiently low so that the fillers do not substantially affect polymer deformability.

The circuit traces which are applied to a surface of the deformable substrate to form the substrate assembly of the invention are made of a ductile metal. "Ductile metal," as used herein, is defined as any metallic material that may be plastically deformed at the bonding temperatures and pressures of the present invention without tearing. Examples of ductile metals useful in the present invention include, but are not limited to, copper, gold, silver, aluminum, tin, lead, zinc, and compatible alloys thereof. Copper is the preferred trace material. The thickness of the ductile metal traces applied to the deformable substrate may vary widely depending on the intended application, but typically the traces, including any optional surface layer applied to the base layer to provide compatibility with the bump material, are about 1 µm to about 10 µm thick, preferably about 2 µm to about 8 µm thick, most preferably about 2 µm to about 5 µm thick. The optional layer which may be used to provide compatibility with the bump is normally about one quarter the thickness of the base layer adjacent the substrate surface. The optional surface layer may be made of any metallic material that is compatible with the bump material, and is preferably made of gold.

The adhesives in the present invention may vary widely depending on the intended application, and any insulating adhesive material which is readily flowable at the bonding temperature may be used. "Readily flowable" is defined as an adhesive that at temperatures above its $T_g$ can be readily squeezed out of the contact areas to provide a clean, metal-to-metal electrical contact at the interface between the bump and corresponding circuit trace. The adhesive material is normally a resin which may be stiffened with heat, actinic radiation (i.e., ultraviolet light), particle beams (i.e., E-beam), or a phase transition within the adhesive (i.e., from amorphous to crystalline). Any of the above may be used in combination with a curing agent, such as an organometallic compound. Useful adhesives include those with an epoxy group, an acryl group, a silicone group, a butadiene group, a modified acrylate group, a cyanate ester group, and compatible mixtures thereof. Preferred adhesives include epoxy resins, phenoxy resins and compatible mixtures thereof.

The adhesives used in the present invention may optionally contain conductive particles. The conductive particles may be present in any amount, but preferably the amount of conductive particles in the adhesive should not cause the adhesive to become isotropically conductive. Normally, about 5% by weight to about 30% by weight of conductive particles are used in the adhesives of the invention, preferably about 10% to about 20%.

The present invention also includes a process for making an adhesively bonded microelectronic assembly using the substrate assembly described above. As shown diagramatically in FIG. 1, the process of the invention includes providing an electronic device having at least one metallic bump, and a deformable substrate having on a surface thereof a circuit structure made up of ductile metal circuit traces. A stiffenable insulating adhesive, preferably in the form of a film, is then positioned between the IC bumps and the substrate assembly to form a layered stack.

The bumps on the IC are then aligned with their corresponding circuit traces on the substrate assembly. Alignment is typically carried out with a flip-chip bonding machine, a precision press which provides very accurate alignment of the stacked IC, adhesive film, and deformable substrate assembly. The flip-chip bonder also has means for accurately controlling the force and temperature applied to the stack. Frequently, alignment of the IC chip, the adhesive film and the substrate assembly is performed using a video-microscope. Chip bonding machines are well known in the art and are commercially available from RD Automation, Piscataway, N.J.; Hughes Bonding Equipment Products, Carlsbad, Calif.; and Micro Robotics Systems, Inc., Chelmsford, Mass.

After the IC chip, adhesive film, and circuit are aligned, the stack is bonded by applying a bonding force. The bonding force used in the process of the invention may vary widely depending on the substrate material used, the adhesive, the thickness and composition of the circuit traces, and the bonding temperature, but typically ranges from about 50 to about 500 Newtons. Then the adhesive is stiffened by any of the well-known techniques listed above, which may include heat, actinic radiation (i.e., ultraviolet light), particle beams (i.e., E-beam), or a phase transition within the adhesive (i.e., from amorphous to crystalline). Of these stiffening techniques, heat cure is preferred, and for the purpose of clarity the discussion which follows will assume that heat cure has been selected as the technique to cure the adhesive.

The bonding force may be applied while the stack is at or near room temperature, may be applied as the stack or portions of the stack are heated to the bonding temperature to begin stiffening the adhesive, or may be applied at the bonding temperature. The bonding area is then heated, preferably rapidly, from room temperature to the bonding temperature, preferably within a period of less than about 10 seconds. The bond area is maintained at the bonding temperature for a predetermined period, preferably about an additional 20 seconds. During this time period the adhesive flows around the IC bumps, the bumps penetrate the adhesive, and the IC bumps are pressed into contact with the circuit traces on the substrate assembly to form a number of bonding sites. As illustrated in FIGS. 1B and 1C, the traces are ductilely deformed around the advancing bump and penetrate into the surface of the substrate a predetermined distance D. Variations in bump height B and variations in the thickness T of the circuit traces may cause individual traces to penetrate slightly different distances D into the surface of the substrate to achieve reliable electrical connection between the IC and the circuit traces. However, as noted above, the penetration distance D of the traces is at least about 1–2 µm, preferably at least about 5 µm, for each interconnected bump and trace.

After the interconnected bumps and traces are pushed into the surface of the substrate to form an electrical connection between the IC and the circuit structure, and the adhesive stiffens, the bonding areas are then cooled, preferably until the temperature reaches about 80° C. or less. The cooling process may be conducted under full bonding force, or if the adhesive is fully stiffened prior to cooldown, the bonding force may be removed before the cooling process begins. The bonding force is then removed and the circuit assembly is ready for testing and evaluation.

The present invention will be further described with reference to the following examples.

EXAMPLES

The same silicon test chip, referred to as the 3M-D120X, was used for all examples. This chip is 6.7×6.7×0.5 mm in size and contains 120 bonding pads which are located in even center-to-center spacings of 200 µm around the periphery of the chip. All pads are bumped with gold. All bumps are 100 µm×100 µm×30 µm in size, and the gold is electroplated and fully annealed.

There were two types of substrate assemblies used in the examples. The first substrate material, an embodiment of the substrate material of the invention, consisted of a 25 µm thick polyester terephthalate (PET) base film, having applied on a surface thereof a Cu test circuit designed specifically for the 3M-D120X test chip. The Cu trace thickness was approximately 2 µm, and over the Cu was electroplated an Au surface trace approximately 0.5 µm thick. The sheet resistivity of these circuit traces was approximately 10 milliohms (mΩ) per square, and the traces were applied using circuit fabrication methods well known to those skilled in the art.

The second substrate, used in the comparative examples below, consisted of a 1 mm thick soda-lime glass base having thereon a test circuit trace of Indium-Tin Oxide (ITO) designed specifically for the 3M-D120X test chip. The ITO circuit traces had a sheet resistivity of approximately 30 Ω per square.

There were two types of adhesives used in the examples. The first adhesive, referred to below as LT-1U, contained no conductive particles. The second adhesive, referred to below as LT-1F, was identical to the first adhesive, except that it contained 12% by weight (6% by volume) of a conductive powder, 20GNR4.6EH from JCI, Inc. This powder consists of 5 µm diameter plastic particles which are metallized with a Ni and Au coating to a level of 20% by weight. The filled adhesive did not contain enough conductive material to achieve isotropic conductivity.

The LT-1U and LT-1F adhesives were supplied in film form. The adhesives comprised a blend of epoxy thermosetting resins with a phenoxy thermoplastic resin at a ratio of approximately 1:1, and were prepared using the materials and methods disclosed in U.S. Pat. No. 4,769,399 to Schenz. The stiffening (e.g., cure) of the adhesives was catalyzed with a preferred thermally-initiated catalyst system disclosed in U.S. Pat. No. 5,362,421 to Kropp et al. The use of this catalyst system permitted a very rapid cure of about 10 to 20 seconds at a bonding temperatures in the range of about 130° C. to about 140° C. The adhesive formulations were slightly tacky films at room temperature. When heated to about 110° C. to about 140° C., the film first softened and flowed, and then rapidly cured to a vitrified solid thermoset resin. After cure, the LT-1 adhesives had a $T_g$ of approximately 130° C. to 140° C.

All flip-chip bonds were prepared on a flip-chip bonder as described above, and alignment of the bumps on the test chip with the circuit traces was performed using a video-microscope. In the bonding procedure, full bonding force, which was varied as described below, was initially applied with the aligned parts at or near room temperature. Once full force was applied, the bond area was heated to 130°–140° C. within roughly 5 to 10 seconds, and then the bond area was held at that temperature for another 20 seconds. The samples were then cooled under full pressure until the temperature reached 80° C. or less.

The sample circuit assemblies were then placed in an environmental chamber for durability testing. At designated various elapsed times, the test samples were removed from the environmental chamber and a four-point resistance test well-known in the art was conducted to measure the contact resistance of the bump-circuit trace electrical interconnection. The layouts of the test chip and the test substrates were designed so that of the 120 pads on the chip, 38 could be probed fairly accurately for interconnection resistance using a four-point measurement technique. Of the remaining 82 pads, 80 were used to build a daisy-chain circuit such that all 80 pads could be probed in series with a single measurement. Probing for short circuits between adjacent pads was also possible with these test substrates. For the PET test substrate, each four-point resistance measurement included approximately 2 squares, or 0.020 ohms ($\Omega$) of extraneous resistance.

Example 1

Example 1 demonstrates the inventive bonding process and provides the bonded circuit assemblies of the invention. Ten (10) samples were prepared from the Cu/PET substrate assemblies and the LT-1U adhesives described above. Two (2) samples were bonded at each of four different bond forces: 67, 133, 200 and 267 Newtons. These bonded samples were aged at 60° C./95% RH for a period of up to 1000 hours, and were monitored periodically for interconnection resistance stability. These samples were aged at 60° C. rather than 85° C. because there was concern that the PET substrate would degrade fairly rapidly at the more extreme aging condition. Bond lines remained free of delamination for all bond forces and over the 1000 hour test period.

The environmental test results for the circuit assemblies of Example 1 testing are shown in FIG. 2A. The penetration of the interconnected bumps and traces into the surface of the deformable substrate creates a circuit assembly with very uniform connection resistances as well as excellent connection stability, even when variations in bump height and trace thickness are considered. This uniformly good performance is observed at bonding pressures as low as 133N.

Figure 6A:
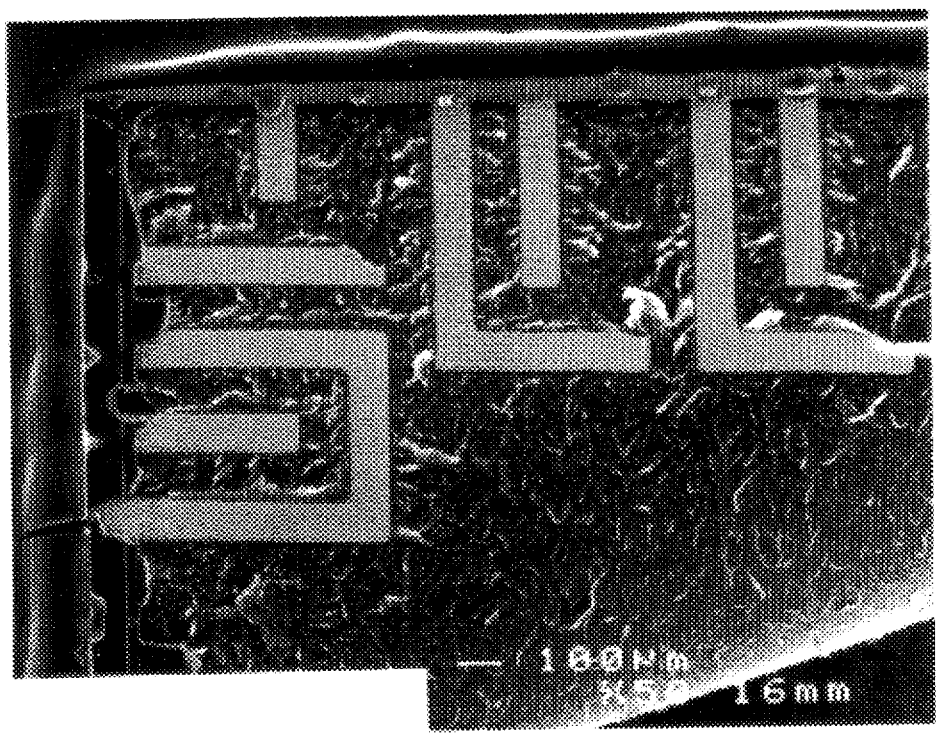
FIG. 6A is an electron photomicrograph at a magnification of 50× depicting the circuit traces on a substrate assembly of the invention, separated from the bumps on the 3M-D120X test chip, following the bonding procedure described in Example 1.
Figure 6B:
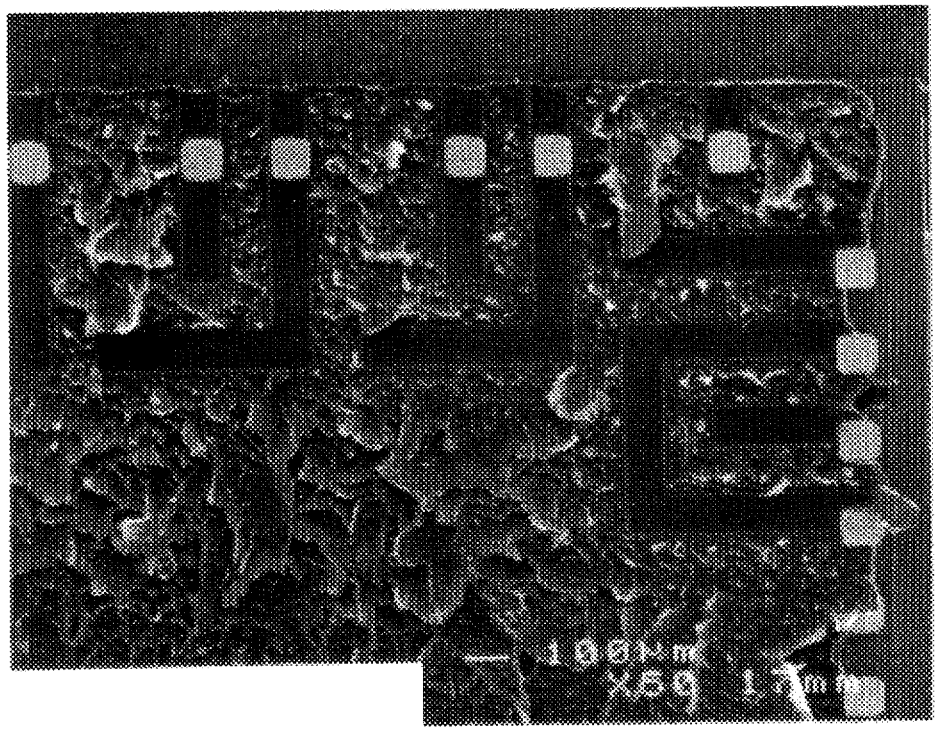
FIG. 6B is an electron photomicrograph at a magnification of 50× depicting the bumps on the 3M-D120X test chip, separated from the circuit traces on the substrate assembly of the present invention, following the bonding procedure described in Example 1.

FIG. 6A depicts the circuit traces on a substrate assembly of the invention, separated from the bumps on the 3M-D120X test chip, following the bonding procedure described in Example 1. FIG. 6B depicts the bumps on the 3M-D120X test chip, separated from the circuit traces on the substrate assembly of the present invention, following the bonding procedure described in Example 1. The bonding conditions in FIG. 6 were: temperature 140° C., force 267N, time 20 seconds.

Figure 7A:
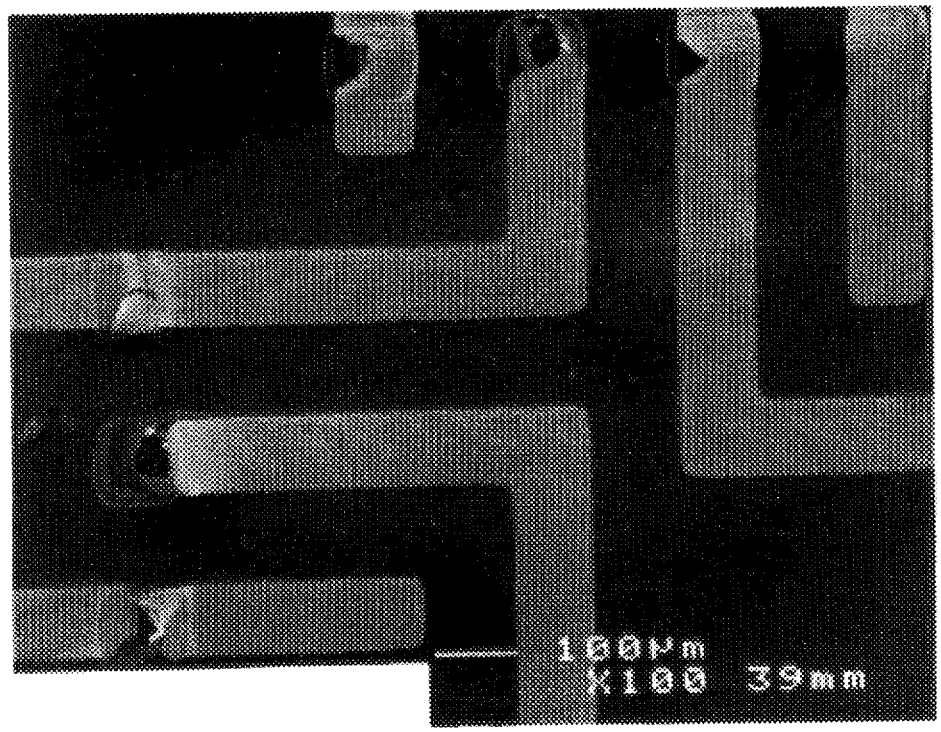
FIG. 7A is an electron photomicrograph at a magnification of 100× depicting the circuit traces on a substrate assembly of the invention, separated from the bumps on the 3M-D120X test chip, following the bonding procedure described in Example 1 without the use of an adhesive.
Figure 7B:
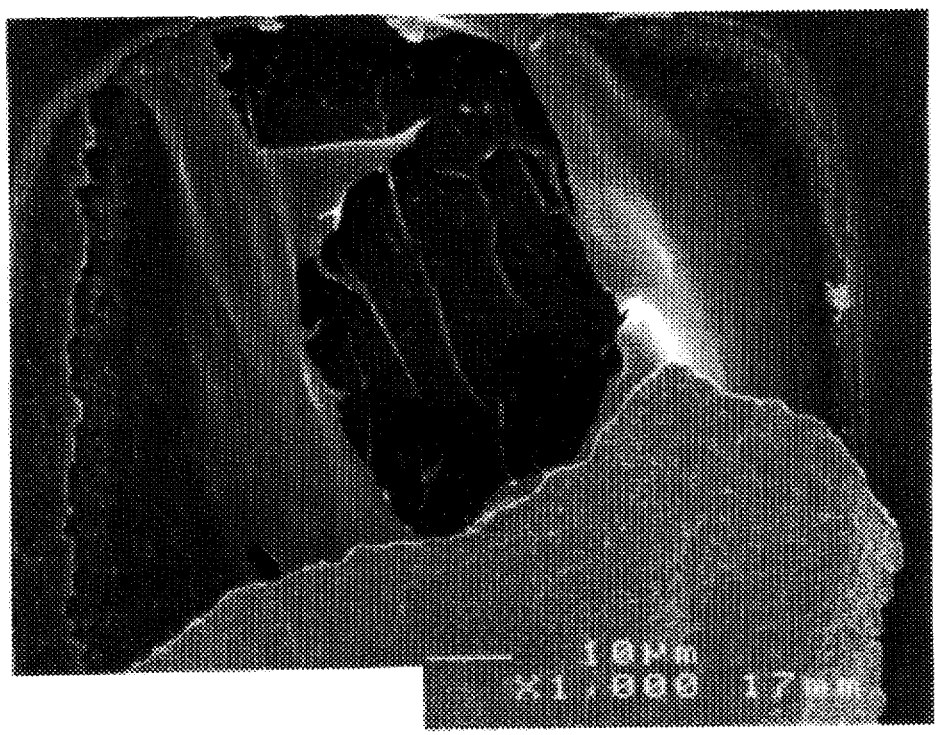
FIG. 7B shows a portion of the circuit traces of FIG. 7A at 1000×.
Figure 7C:
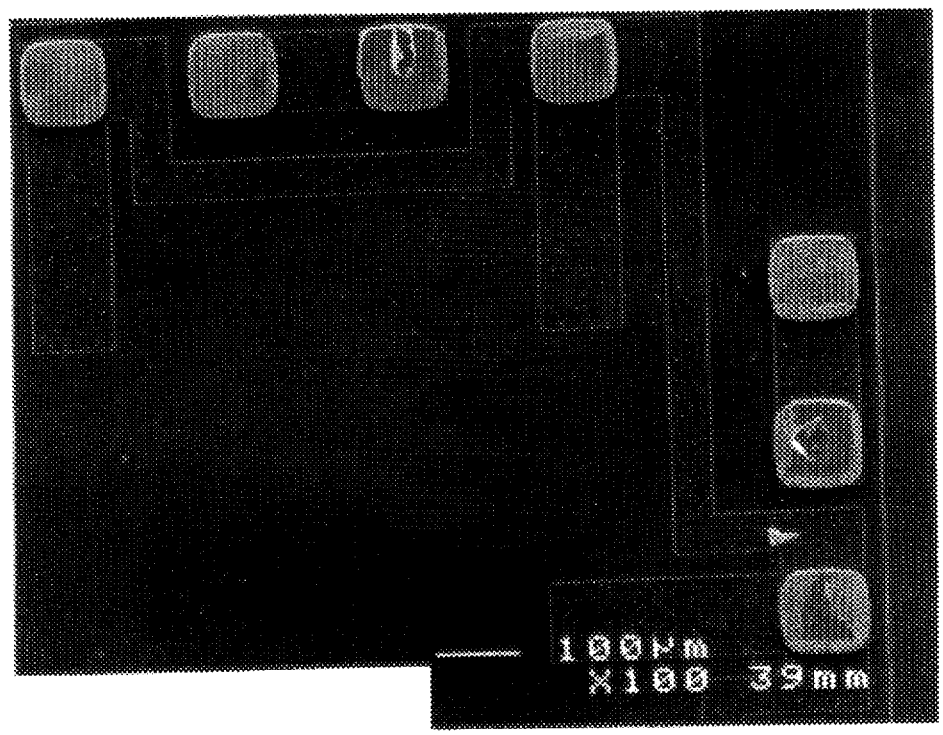
FIG. 7C is an electron photomicrograph at a magnification of 100× depicting the bumps on the 3M-D120X test chip, separated from the circuit traces on the substrate assembly of the present invention, following the bonding procedure described in Example 1 without the use of an adhesive.
Figure 7D:
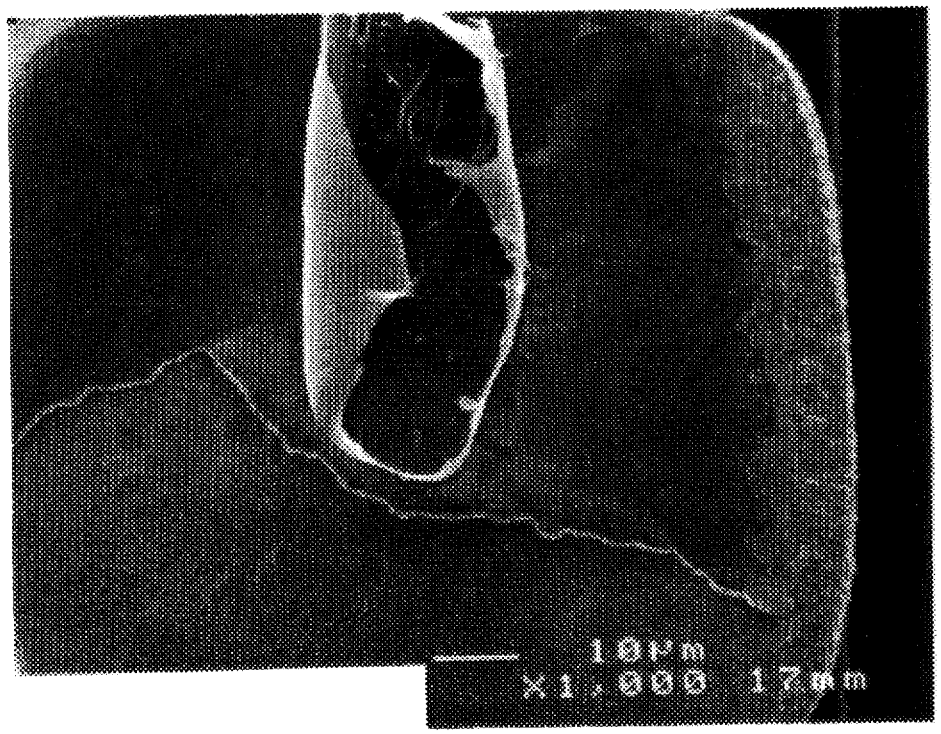
FIG. 7D shows a portion of the bumps of FIG. 7C at 1000×.

FIGS. 7A and 7B depict the circuit traces on a substrate assembly of the invention, separated from the bumps on the 3M-D120X test chip, following the bonding procedure described in Example 1 without the use of an adhesive. FIGS. 7C and 7D depict the bumps on the 3M-D120X test chip, separated from the circuit traces on the substrate assembly of the present invention, following the bonding procedure described in Example 1 without the use of an adhesive. In the high magnification micrograph of FIG. 7D, gold/copper plating from circuit traces can be seen adhering to bump along with some PET (curled up). The bonding conditions in FIG. 7 were: temperature, 140° C.; force, 267N; time, 20 seconds.

Figure 8A:
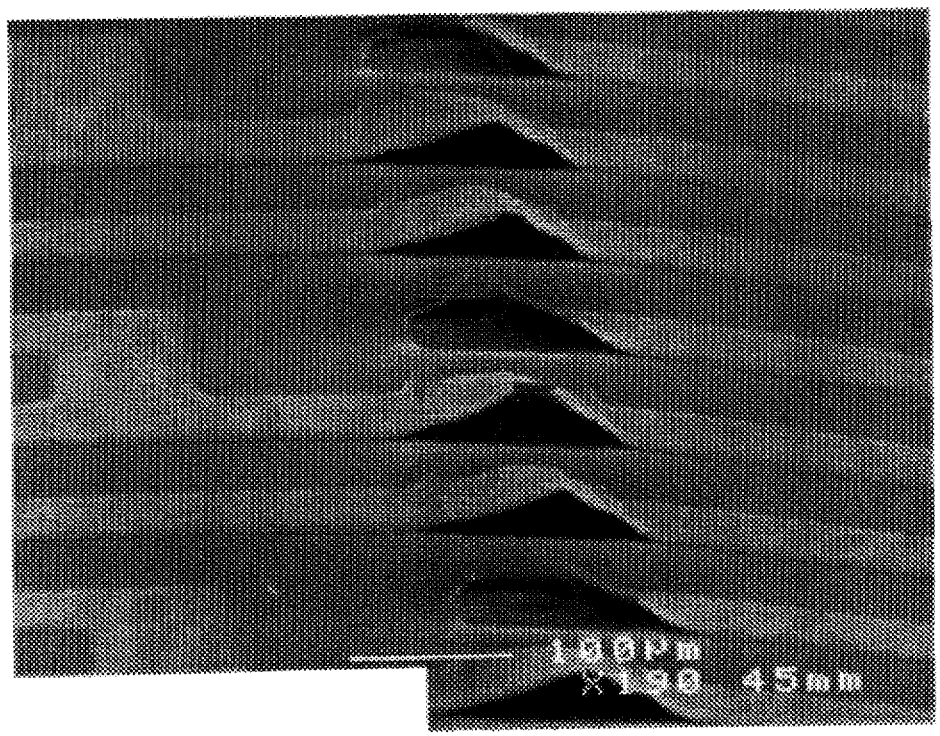
FIG. 8A is an electron photomicrograph at a magnification of 190× of the pulled-apart bond in FIG. 7A in which the sample has been rotated 70° from the vertical.
Figure 8B:
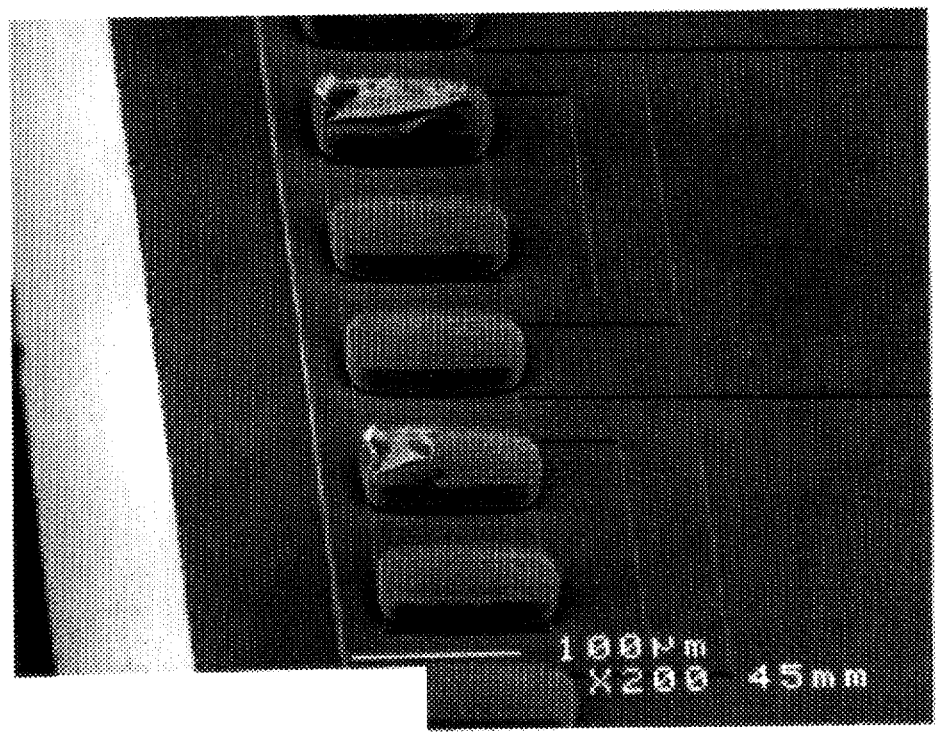
FIG. 8B is an electron photomicrograph at a magnification of 200× of the pulled-apart bond in FIG. 7C in which the sample has been rotated 70° from the vertical.

FIGS. 8A and 8B show the pulled-apart bond of FIG. 7 in which the sample has been rotated 70° from vertical. FIGS. 8A shows the circuit side of the bond and 8B shows the bump (chip) side of the bond. At this viewing angle, the delamination of the metal circuit trace from the substrate surface is clearly visible. The delamination was caused by the force required to pull apart the bonded assembly.

Figure 4:
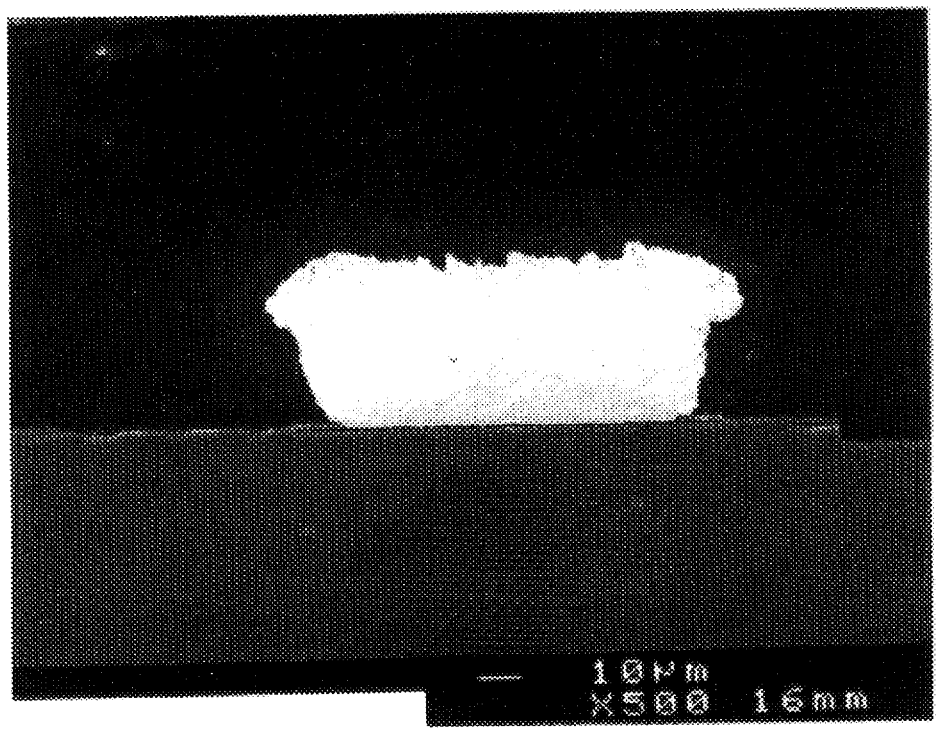
FIG. 4 is a electron photomicrograph of a section of a bump on a 3M-D120X test chip at a magnification of 500× taken prior to a bonding procedure.
Figure 5A:
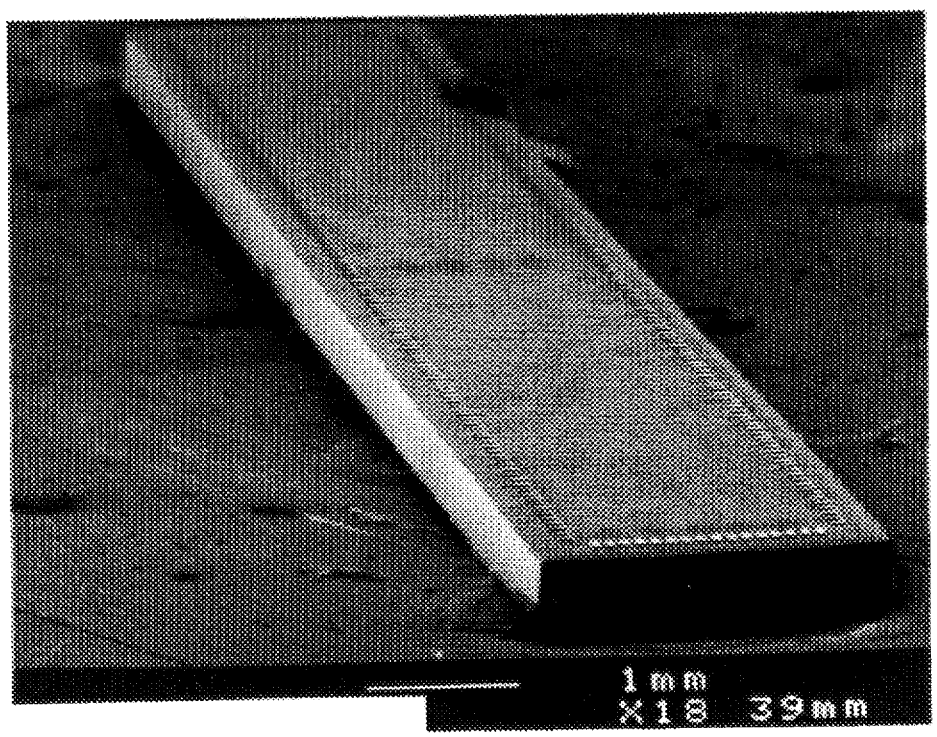
FIG. 5A is an electron photomicrograph at a magnification of 18× of a MCC "slim" test chip which is representative of the electronic devices which may be adhesively joined to the substrate assemblies of the present invention.
Figure 5B:
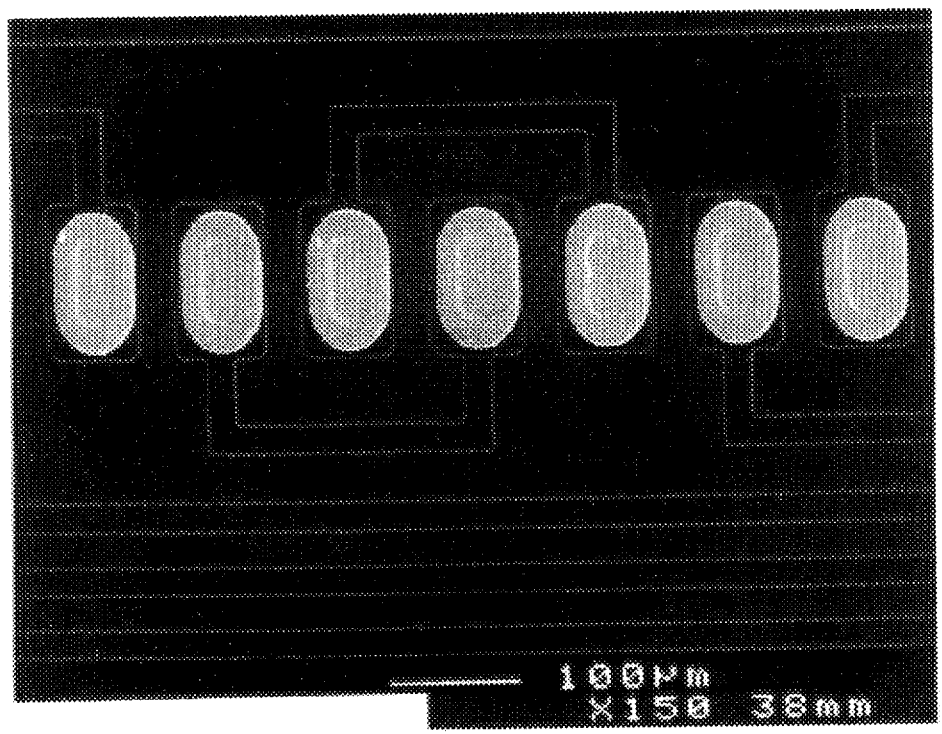
FIG. 5B is an electron photomicrograph at 150× of a series of bumps on the test chip of FIG. 5A.
Figure 5C:
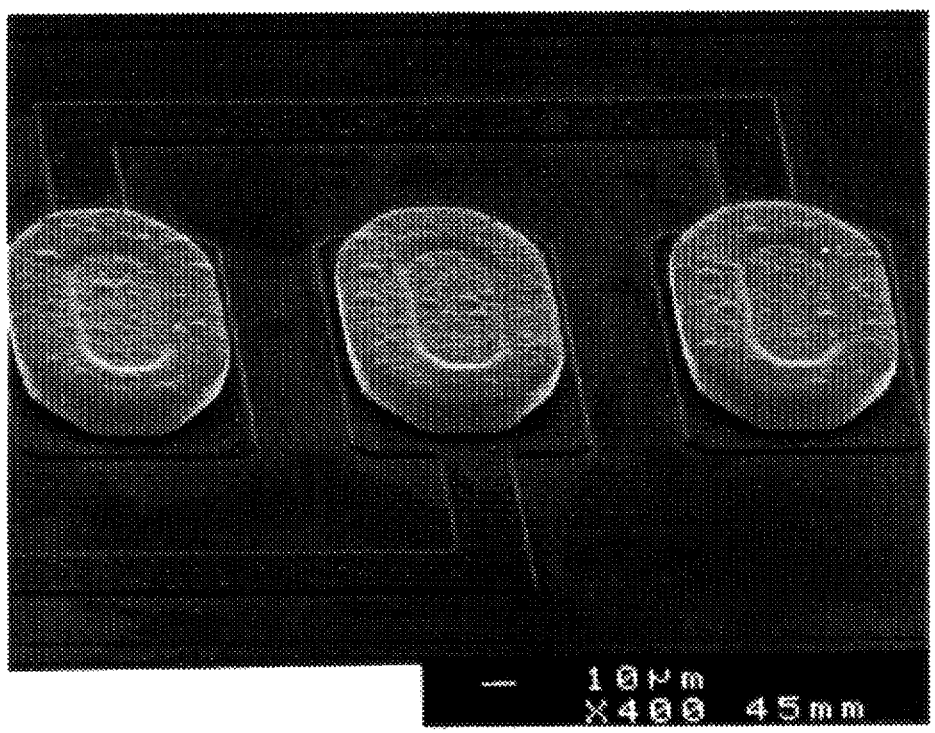
FIG. 5C is an electron photomicrograph at 400× of the bumps on the test chip of FIG. 5A.
Figure 5D:
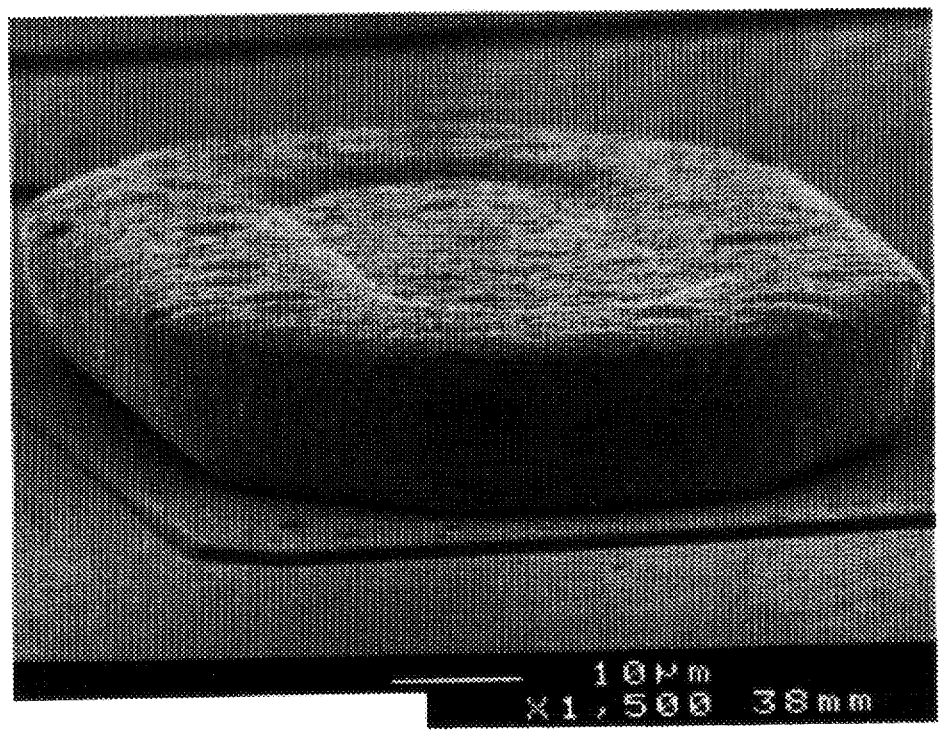
FIG. 5D is an electron photomicrograph at 1500× of the bumps on the test chip of FIG. 5A.
Figure 10A:
FIG. 10A is an electron photomicrograph at a magnification of 5000× depicting the pulled-apart bond of FIG. 7A.
Figure 10B:
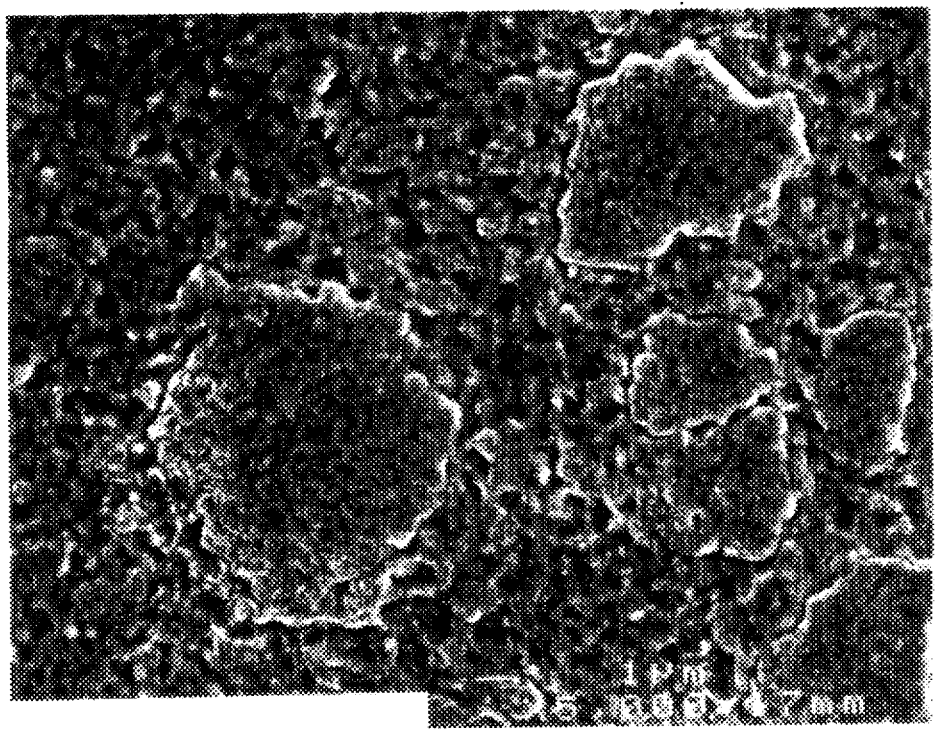
FIG. 10B is an electron photomicrograph at a magnification of 5000× depicting the pulled-apart bond of FIG. 7C.

FIGS. 10A and 10B depict the pulled-apart bonds of FIGS. 7A and 7C, respectively, at high magnification. These figures show that the pointed gold asperities on the bump which are present prior to the bonding procedure (see FIG. 4) become flattened during bonding. The duster of small whitish spheres opposite the shadowed area in the shallow crater in FIG. 10A are believed to be ductile fractures which may be evidence of fusion bonding between the gold bump and the gold surface of the circuit trace.

Figure 9A:
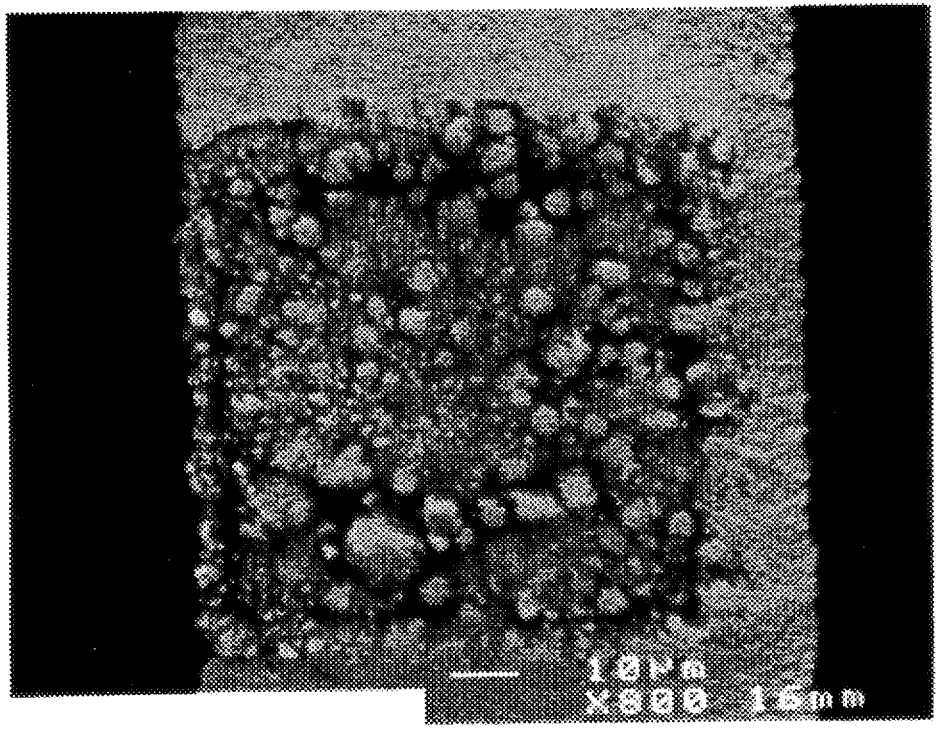
FIG. 9A is an electron photomicrograph at a magnification of 800× depicting the circuit traces on a substrate assembly of the invention, separated from the bumps on the 3M-D120X test chip, following the bonding procedure described in Example 1.
Figure 9B:
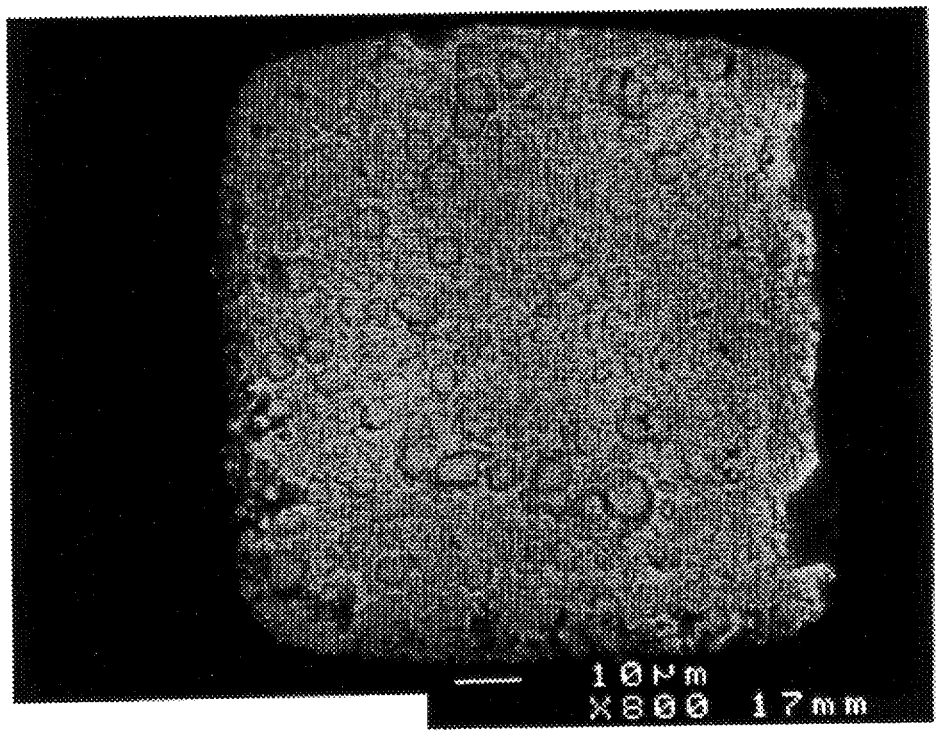
FIG. 9B is an electron photomicrograph at a magnification of 800× depicting the bumps on the 3M-D120X test chip, separated from the circuit traces on the substrate assembly of the present invention, following the bonding procedure described in Example 1.

FIG. 9A depicts the circuit traces on a substrate assembly of the invention, separated from the bumps on the 3M-D120X test chip, following the bonding procedure described in Example 1. FIG. 9B depicts the bumps on the 3M-D120X test chip, separated from the circuit traces on the substrate assembly of the present invention, following the bonding procedure described in Example 1. The dark areas are adhesive revealed by back-scattered electrons. The photographs in FIG. 9 clearly demonstrate that the adhesive is removed from the bump-trace interface during bonding to produce a highly reliable electrical connection.

FIGS. 11A–F depict a cross-sectional view of a bump bonded to a circuit trace on a substrate assembly of the invention (substrate oriented at top of photo) prepared according to the procedure in Example 1 with increasing levels of bonding force. The "muffin-like" edges of the bump appear to be forced downward as increasing bonding pressure is applied. In the 267 Newton sample (FIGS. 11E and 11F), this edge has folded all the way down to the chip. FIGS. 11A–F show that the gold-coated copper traces are bent over the edge and stretch in conformity to the periphery of the bump as the bump is deformed. The traces were probably bonded to the bumps at this point and part of the stretch (tensile strain) coincides with the deformation of the bumps. The softness of the bump and small radius of curvature at the bump edge therefore tend to spread out the strain induced in the traces over a larger area.

Figure 11A:
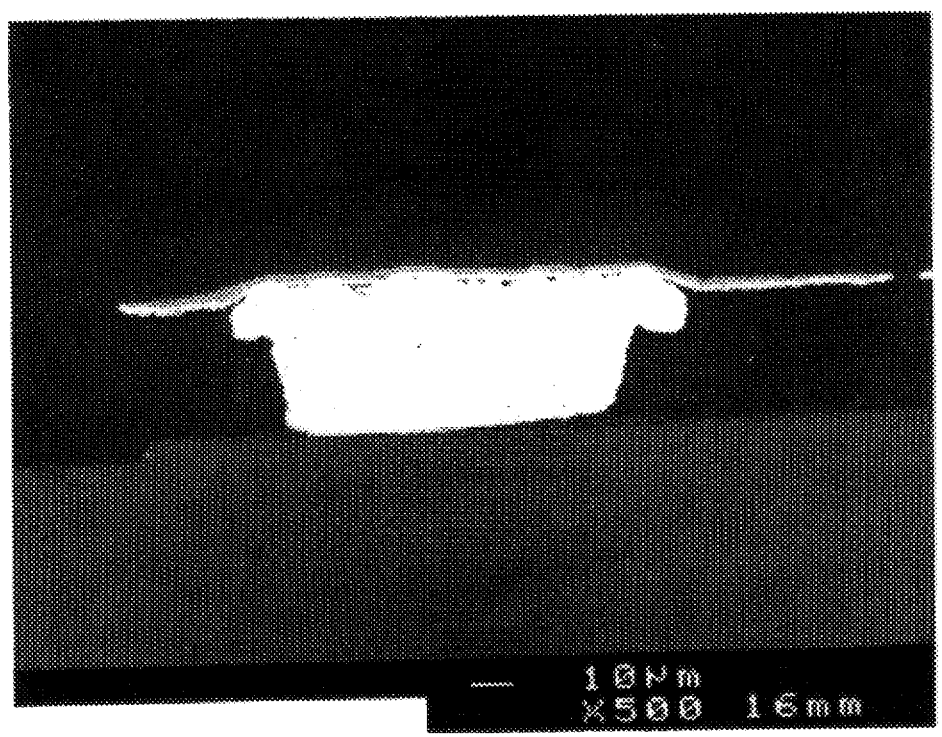
FIG. 11A is an electron photomicrograph at a magnification of 500× depicting a cross-sectional view of a bump bonded to a circuit trace on a substrate assembly of the invention at a bonding force of 133N.
Figure 11B:
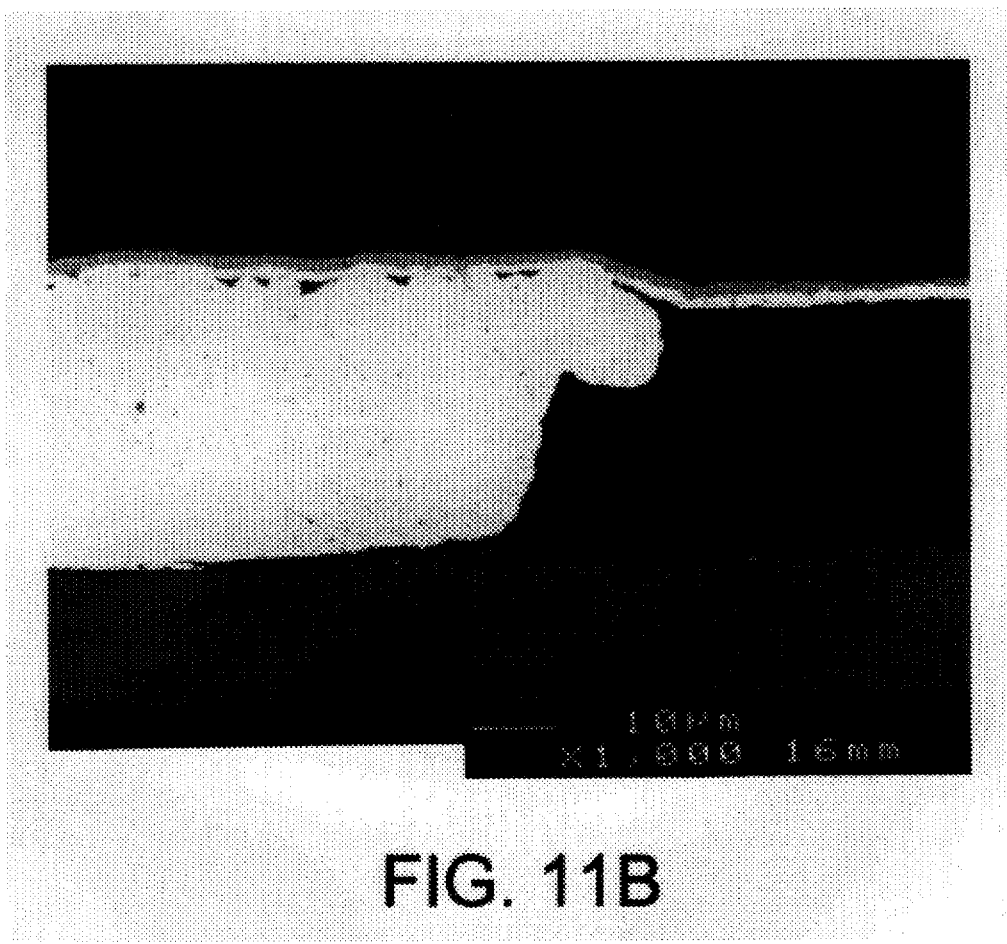
FIG. 11B is an electron photomicrograph of the bond of FIG. 11A at a magnification of 1000×.
Figure 11C:
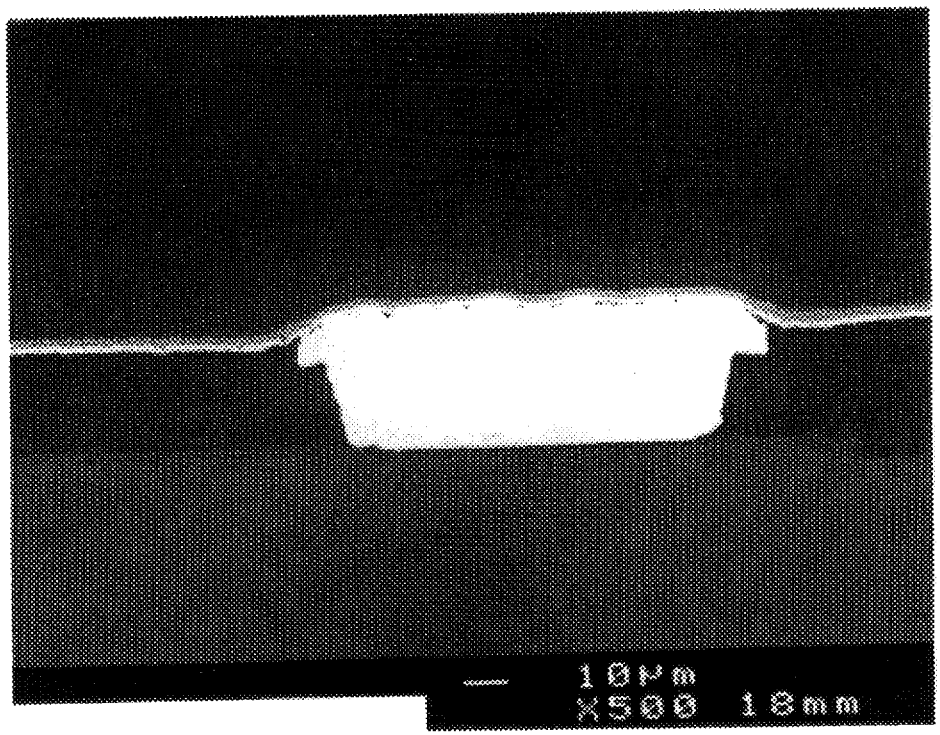
FIG. 11C is an electron photomicrograph at a magnification of 500× depicting a cross-sectional view of a bump bonded to a circuit trace on a substrate assembly of the invention at a bonding force of 200N.
Figure 11D:
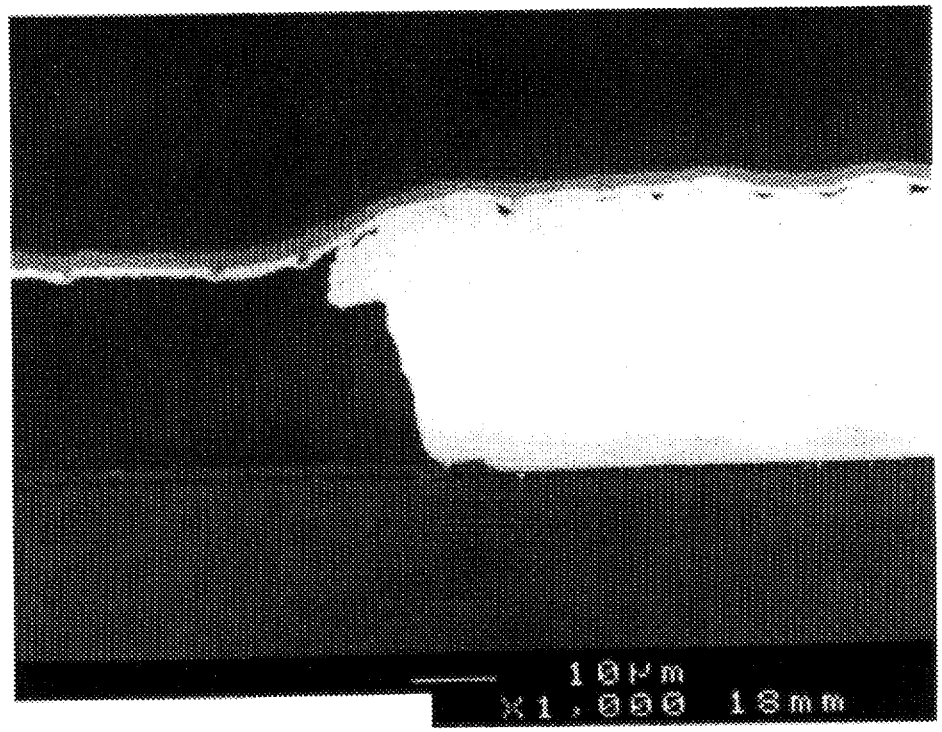
FIG. 11D is an electron photomicrograph of the bond of FIG. 11C at a magnification of 1000×.
Figure 11E:
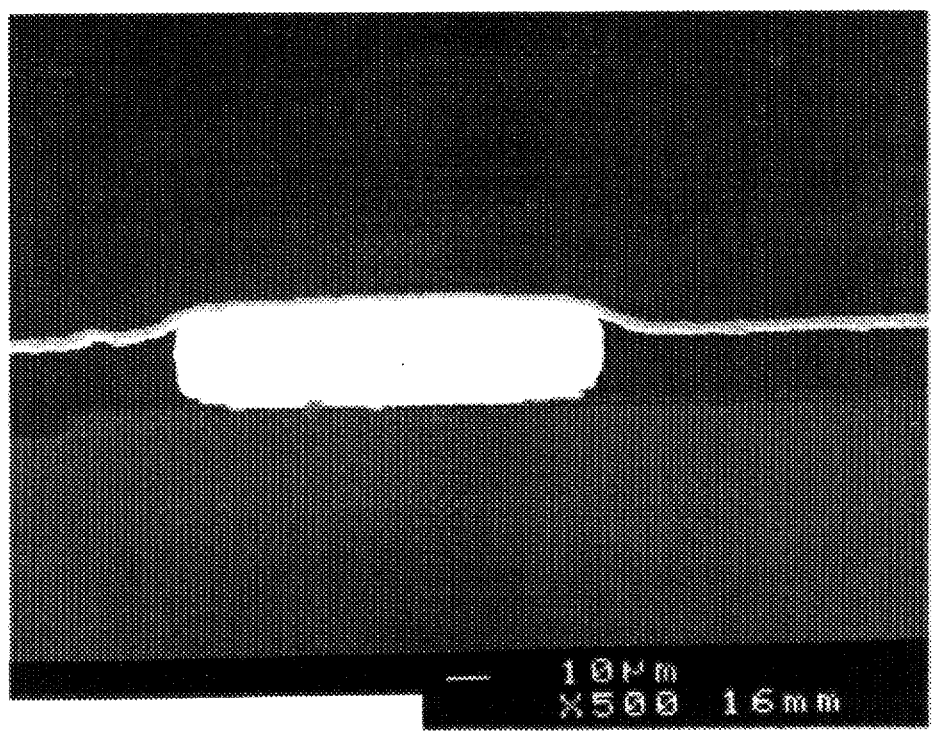
FIG. 11E is an electron photomicrograph at a magnification of 500× depicting a cross-sectional view of a bump bonded to a circuit trace on a substrate assembly of the invention at a bonding force of 267N.
Figure 11F:
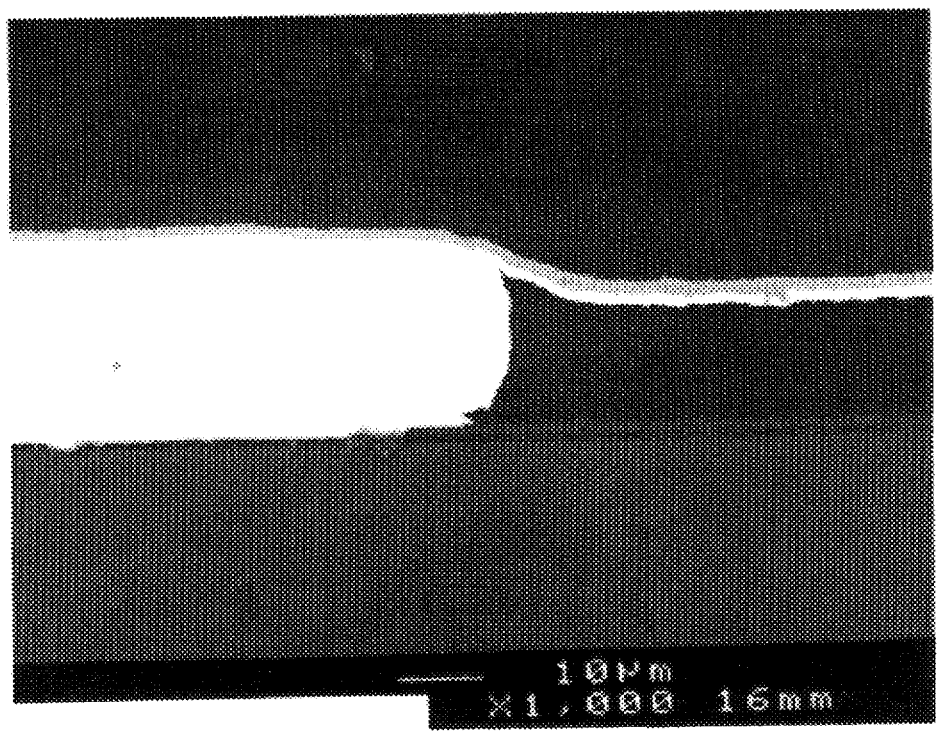
FIG. 11F is an electron photomicrograph of the bond of FIG. 11E at a magnification of 1000×.

FIGS. 11A–F clearly show the collapse of the gold bump (from 40, to 36, to 34 and finally 24 μm thickness), thinning of adhesive film, and increasing depth of penetration of the PET film (from 0, to 4.5 to 7 and finally 8 μm) as bonding force is increased from 0 to 133 to 200 and then to 267N (see FIGS. 11A, B; C, D; and E, F; respectively).

Example 2

Example 2 was the same as Example 1 except that the adhesive LT-1F was used. Ten (10) samples were prepared, aged, and monitored in the same manner as the samples of Example 1. As in Example 1, bond lines seemed to remain free of delamination in all samples over the course of the testing.

Figure 2B:
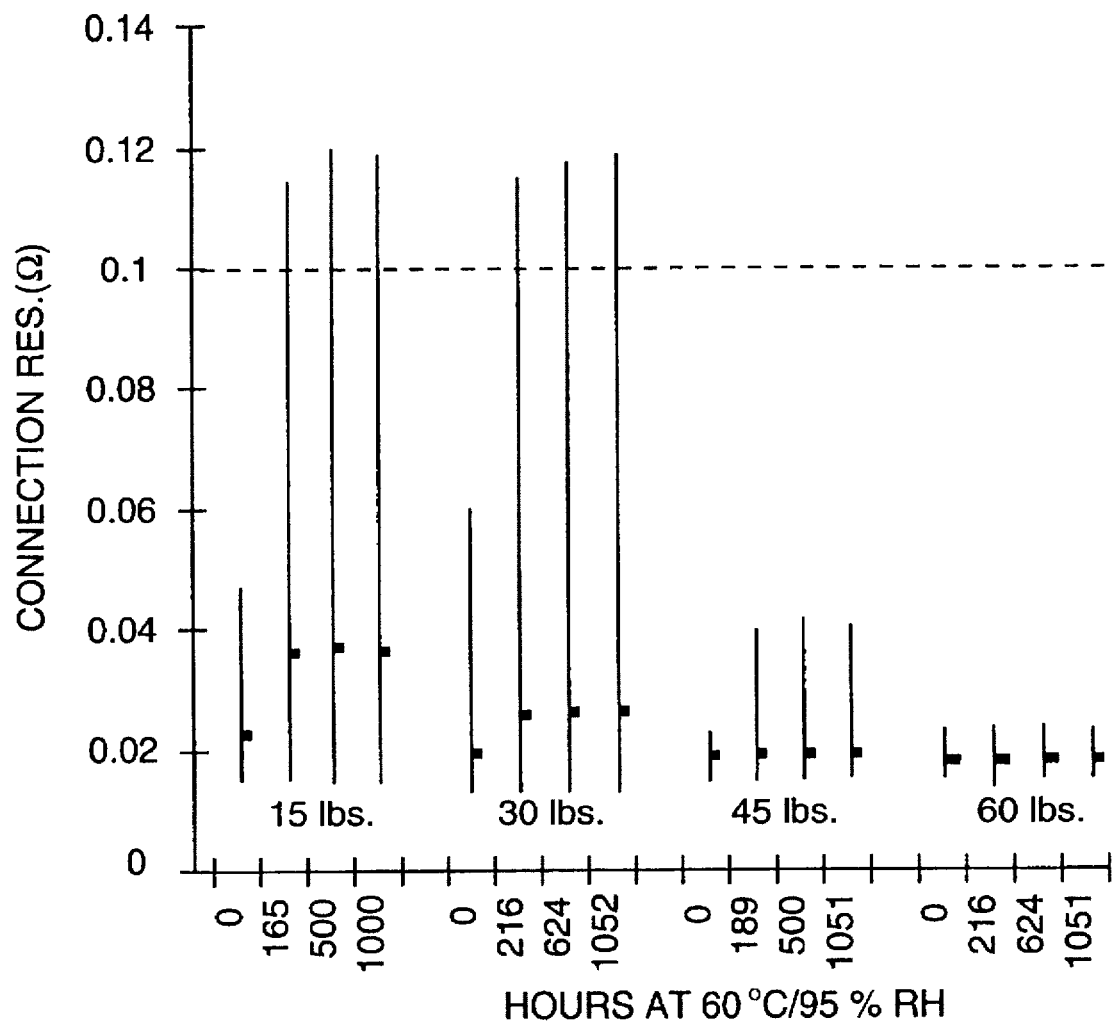
FIG. 2B is a plot showing the results of the environmental testing of the electronic circuit assemblies prepared in Example 2.

The results of the environmental testing are shown in FIG. 2B. The results from Example 2 show more variability at lower bond forces than those of Example 1. However, the presence of the conductive particles did seem to prevent contact failures, even for a bond force of 67 Newtons. The higher resistances measured in these examples were probably due to the high resistivity of the conductive particles. The conductive particles are plated to a level of 20% by weight. For a 5 μm diameter particle, this corresponds to a metal skin thickness of only about 1000 Angstroms. Therefore, the ohmic resistance of such a particle could be at least a few hundred milliohms. At the higher bond forces, the occurrence of reduced connection resistances probably was an indication of an increasing level of direct contact between the bump and the circuit trace suppressing the effect of the particles.

Example 3

Example 3 was a comparative example to demonstrate the effectiveness of prior art bonding methods. Ten (10) samples were prepared by bonding 10 of the 3M-D120X test chips to ten of the ITO/glass test substrates using the LT-1U adhesive. The bonding method used was similar to that described in U.S. Pat. No. 4,749,120 to Hatada. The curing condition was 140° C. for 20 seconds. Two samples were bonded at each of five different bond forces: 66.7, 133, 222, 334, and 445N. The bonded samples were aged at 85° C./85% relative humidity for a period of up to 1000 hrs, and were monitored periodically for interconnection resistance stability.

Figure 3A:
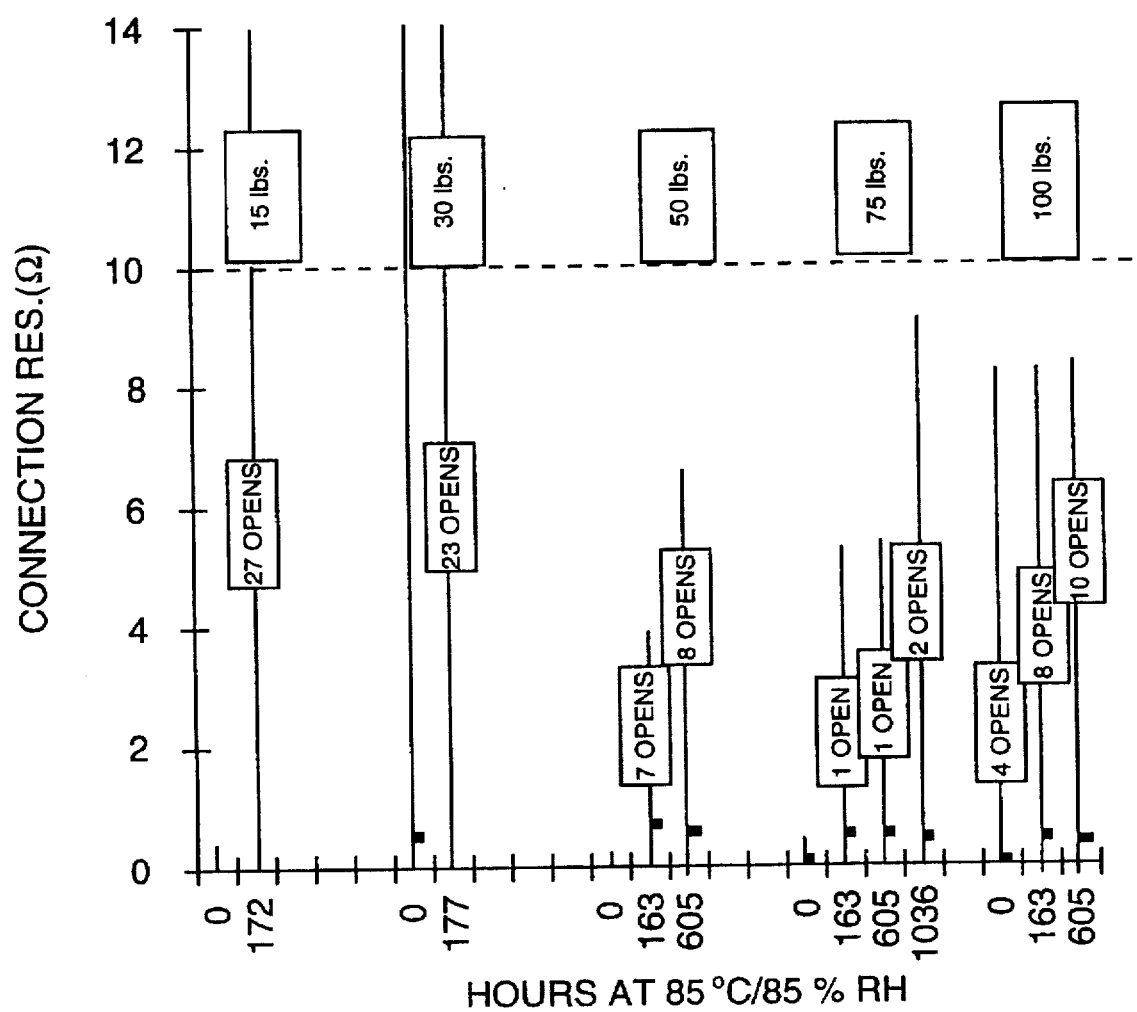
FIG. 3A is a plot showing the results of the environmental testing of the electronic circuit assemblies prepared in Example 3.

The results of the environmental testing are shown in FIG. 3A. At this aging condition, the adhesive joints were well below their $T_g$ and should be expected to be stable. At bonding forces of 222 and 445 Newtons, some delamination at the adhesive to glass interface was found to occur after a few weeks in the aging environments. This seemed to indicate that these bond forces were excessive and resulted in bond lines which were too thin. At all other bond forces, the bond areas remained clear and free of any delamination. At all levels of bonding force, the connection resistance was higher than in the present invention, and showed an increased number of open circuits. These results are believed to be caused by the inability of the non-deformable substrate assembly to accommodate variations in bump height and trace thickness.

Example 4

Figure 3B:
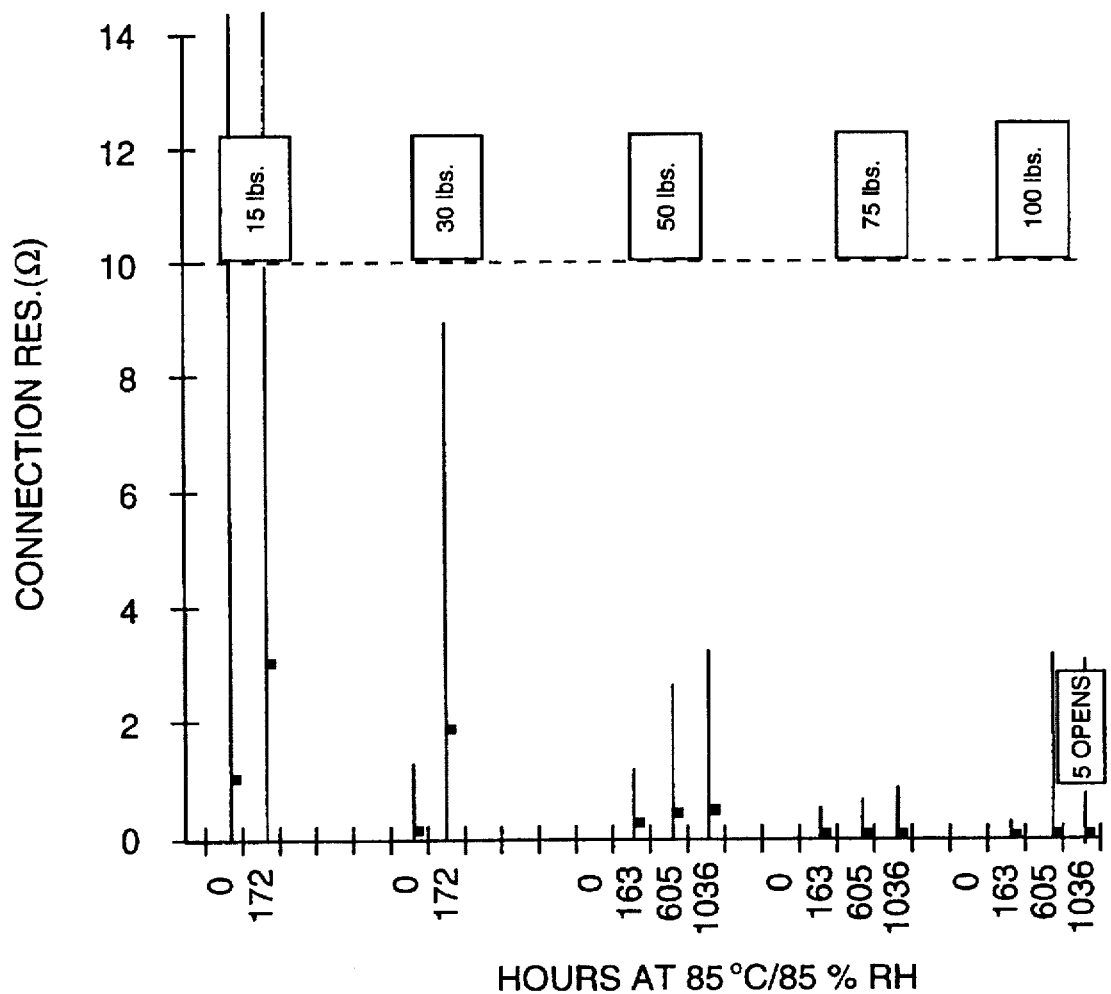
FIG. 3B is a plot showing the results of the environmental testing of the electronic circuit assemblies prepared in Example 4.

Example 4 was the same as Example 3 except that the adhesive LT-1F was used. Ten (10) samples were prepared, aged, and monitored in the same manner as the samples of Example 3. The results of the environmental testing are shown in FIG. 3B.

The results of Example 4 show a marked improvement achieved by adding a small amount of the deformable conductive powder. When a rigid, non-deformable substrate is used, the conductive powder appears to provide some accommodation of stress relaxation in the adhesive which is not provided by the bumps alone.

Example 5

This example demonstrates the effect of varying copper trace thickness, PET substrate thickness, and bonding temperature on penetration of the interconnected bumps and traces into the surface of the substrate. Samples were prepared using the standard bonding procedure described in Example 1. The adhesive used was a LT-1U film having a thickness of 25 μm. The substrate assembly was PET with a thickness of 25 or 50 μm which was plated with gold plated copper circuit traces having a thickness of 3 or 8 μm.

The bonding conditions used were: bonding temperature 140° or 150° C., bonding force 200N, time 20 seconds.

Therefore, this example comprised a 2×2×2=8 level test matrix with 2 temperatures (140° and 150° C.), 2 PET thicknesses (25 and 50 micrometers), and 2 copper trace thickness (3 and 8 μm). Two samples were prepared for each test level; 16 samples total. The 16 samples were environmentally aged for 1000 hours at 60C, 95% relative humidity, using the standard aging procedure described in Example 1.

Bump penetration into the flex substrate was observable in all cases. FIGS. 12A–12D (substrate oriented at top of photo) show scanning electron photomicrographs (500×) of cross-sections of the adhesively-bonded assemblies.

FIGS. 12E–12H (substrate oriented at top of photo) depict optical photomicrographs (200×) of cross-sections corresponding to those of FIGS. 12A–12D.

Figure 12:
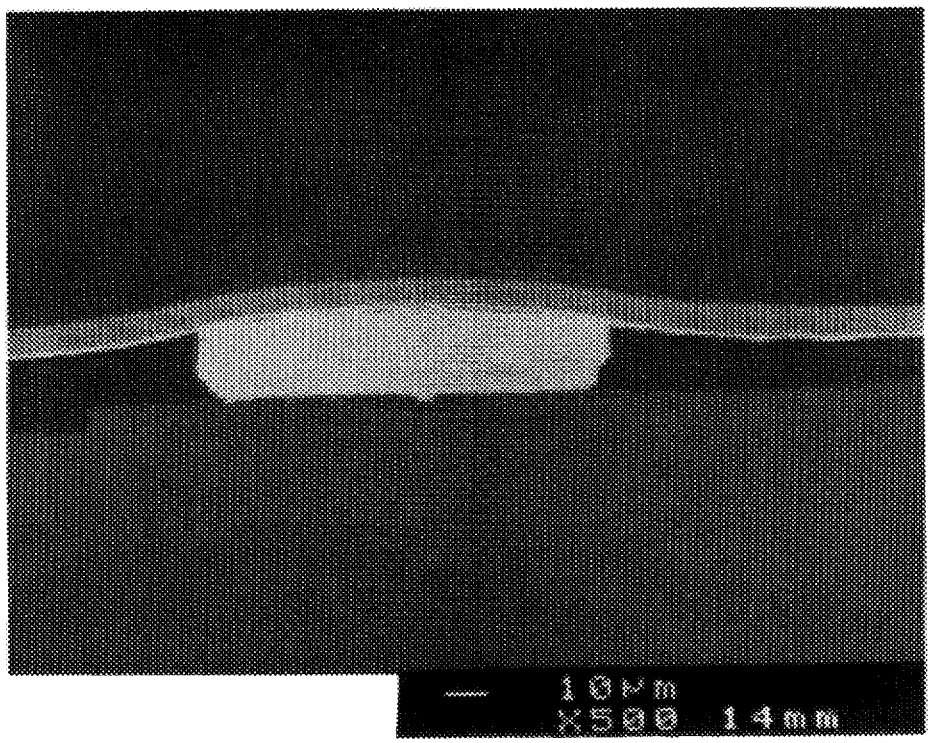
FIGS. 12A–12D are electron photomicrographs at a magnification of 500× depicting cross-sections of the adhesively bonded assemblies in Example 5.
FIGS. 12E–12H are optical photomicrographs at a magnification of 200× depicting cross-sections corresponding to those of FIGS. 12A–12D.
FIGS. 12I is a scanning electron photomicrograph in backscatter mode at a magnification of 600× showing the wiping action that occurs as the edge of the bump deforms and stretches the circuit trace.
Figure 12:
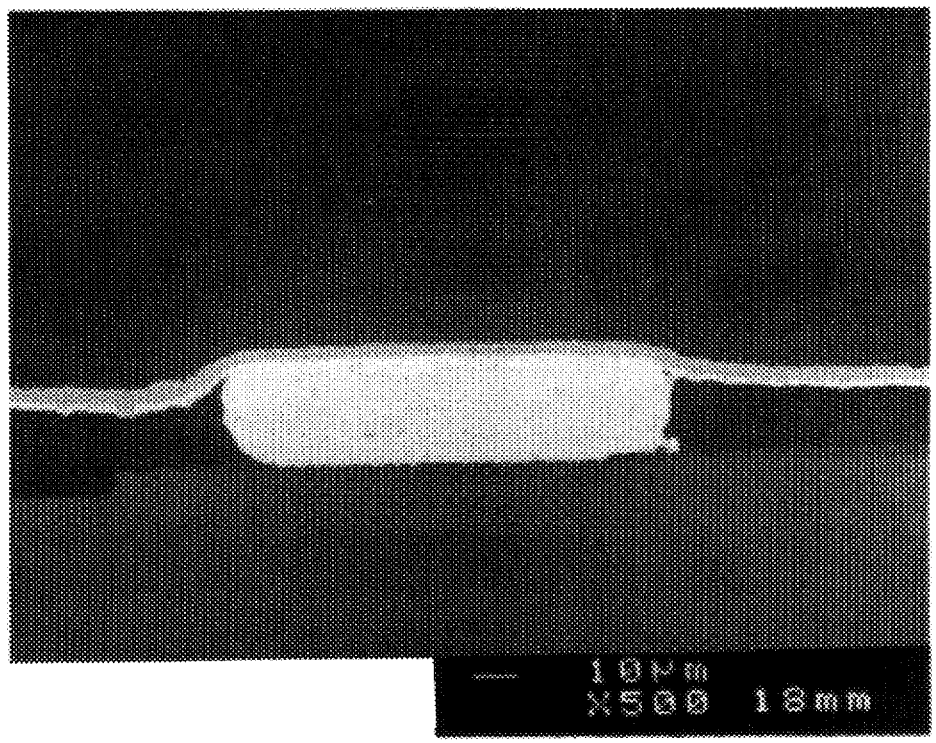
Figure 12:
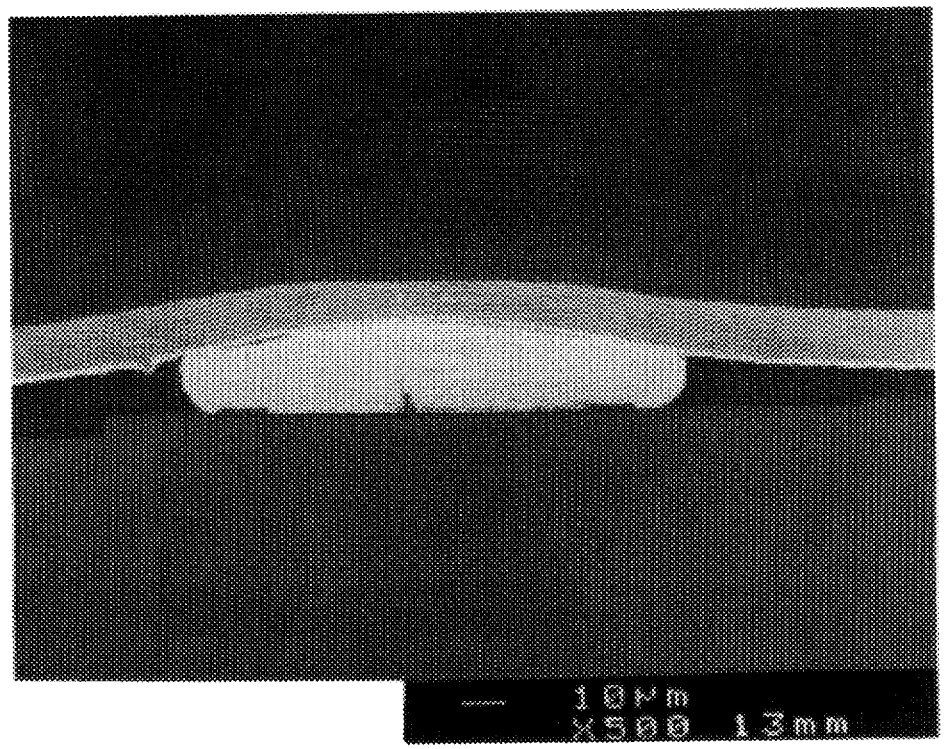
Figure 12:
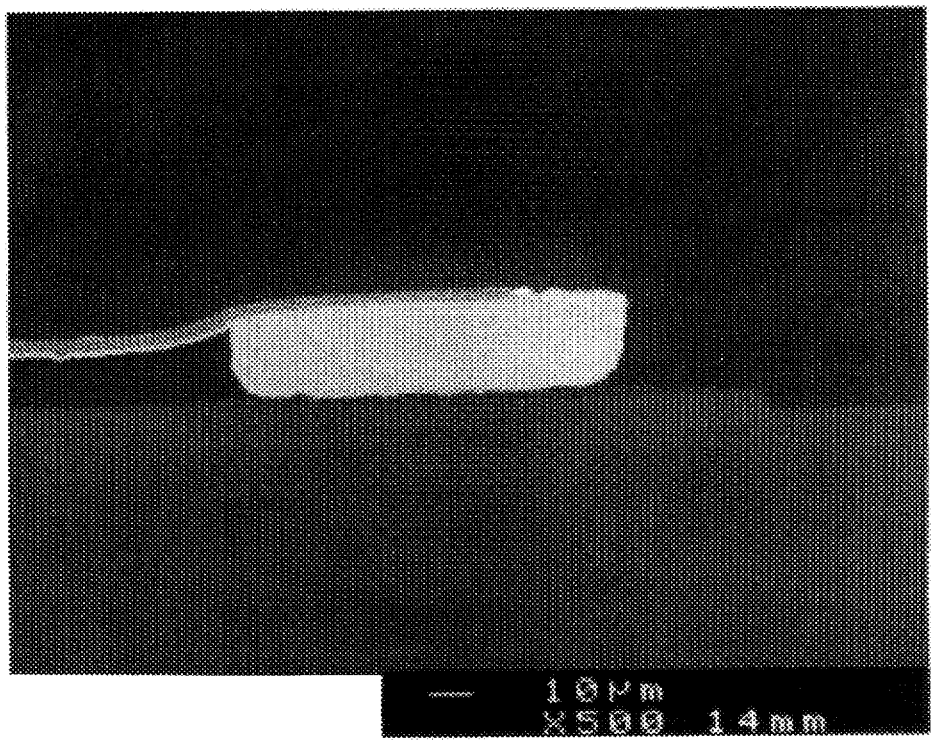
Figure 12:
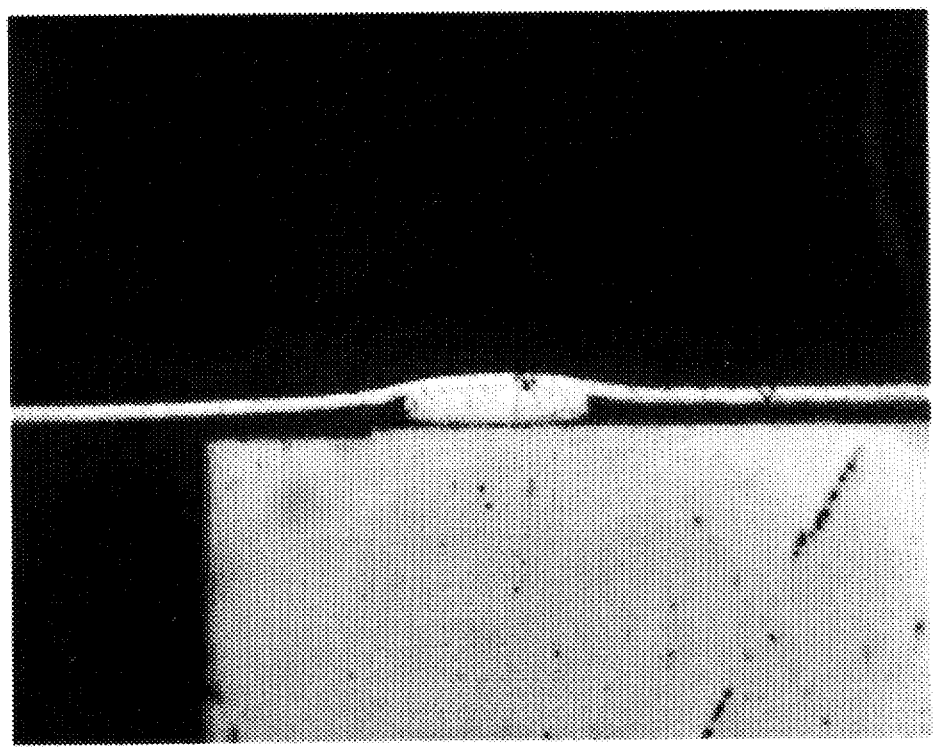
Figure 12:
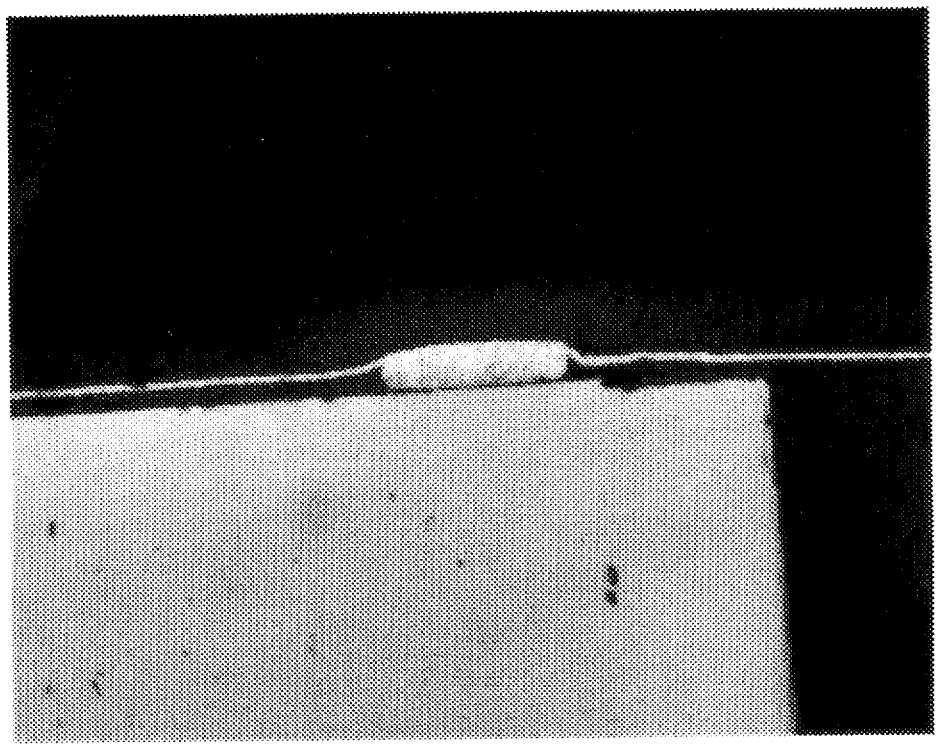
Figure 12:
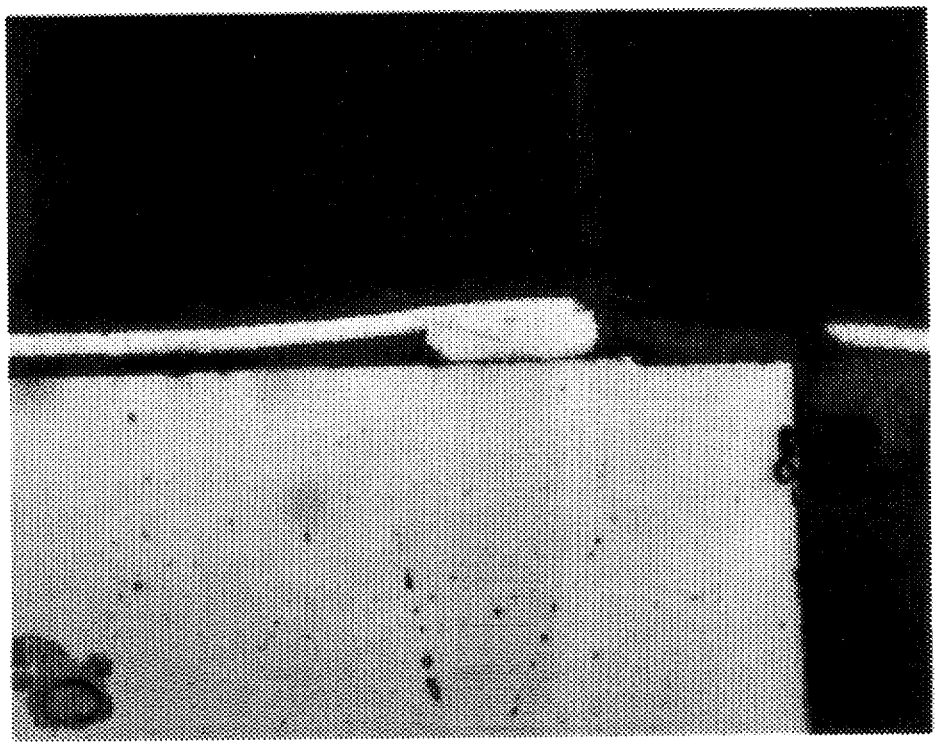
Figure 12:
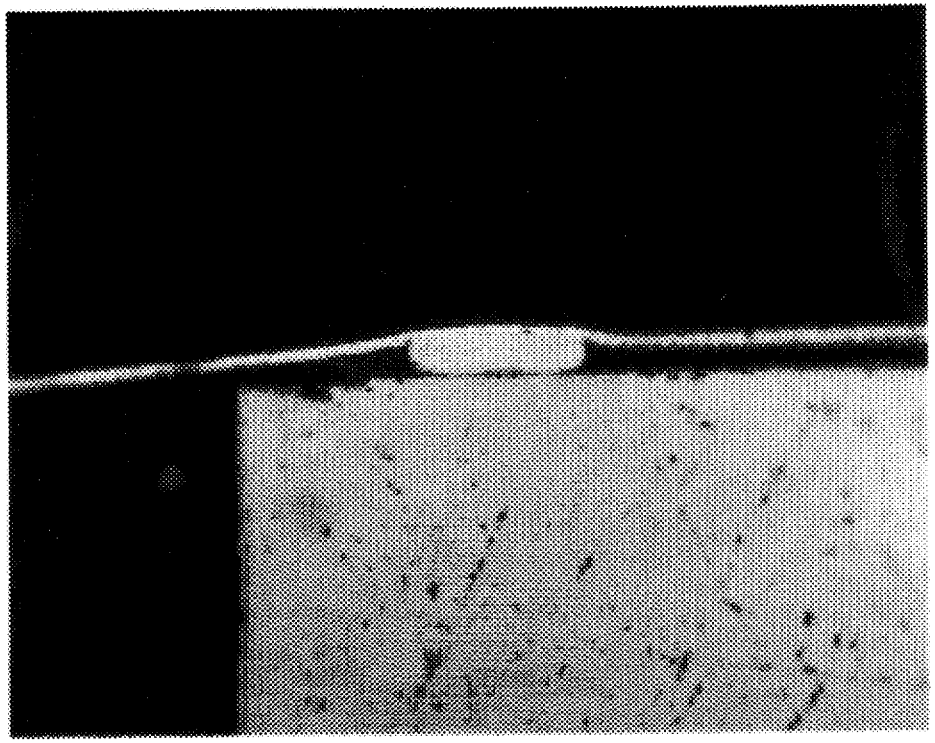
Figure 12:
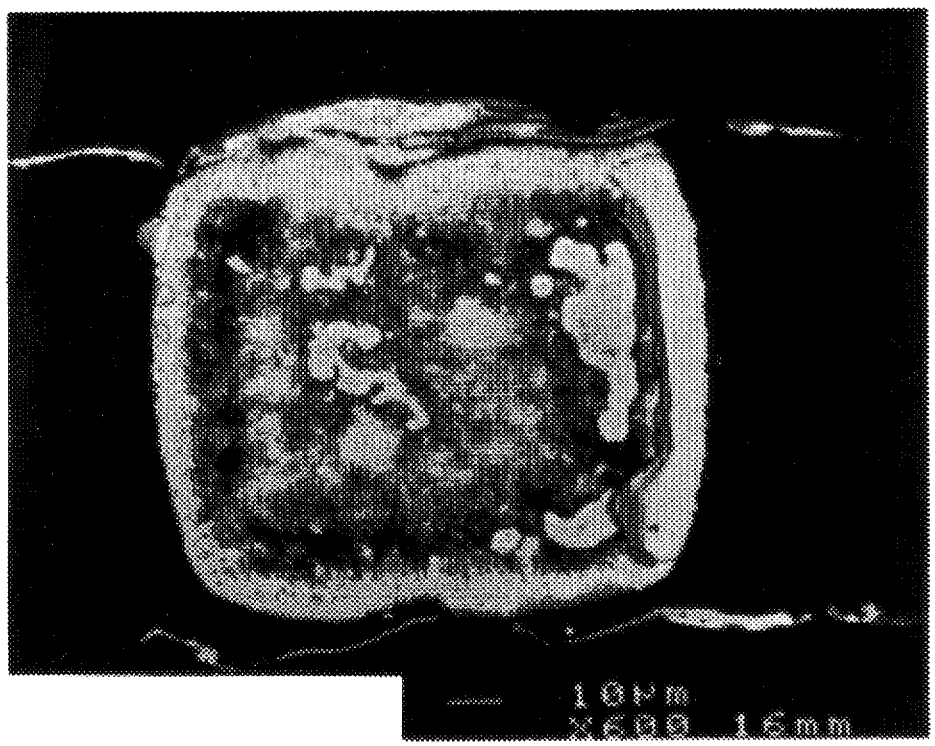

The flex-circuits depicted in FIG. 12 have PET substrate thicknesses and copper circuit trace thicknesses as shown in Table 1 below:

TABLE 1

| FIG. | Magnification (X) | PET Thickness (μm) | Trace Thickness (μm) |
|---|---|---|---|
| 12A | 500 (SEM) | 50 | 8 |
| 12B | 500 (SEM) | 50 | 3 |
| 12C | 500 (SEM) | 25 | 8 |
| 12D | 500 (SEM) | 25 | 3 |
| 12E | 200 (Optical) | 50 | 8 |
| 12F | 200 (Optical) | 50 | 3 |
| 12G | 200 (Optical) | 25 | 8 |
| 12H | 200 (Optical) | 25 | 3 |

FIGS. 12B, D, F, and H (3 μm copper traces on 50 and 25 μm PET, respectively) show sharp bending (high radius of curvature) of the circuit traces as they are bent around the periphery of the bump. FIGS. 12A, C, E, and G (8 μm copper traces on 50 and 25 μm PET, respectively) show a gradual bending indicative of the greater stiffness of the thicker circuit trace.

FIG. 12I is a scanning electron photomicrograph in backscatter mode (600×, substrate oriented at the top of photo) showing the wiping action that occurs as the edge of the bump deforms and stretches the circuit trace, thus enhancing the metal-to-metal contact between bump and circuit trace, thereby increasing the reliability of the pressure engaged electrical interconnection that is formed. This intimate electrical contact can be inferred by the brightness of the image at the edges of the bump and corresponding deformed trace due to the abundance of electron emission at the gold-to-gold interfaces involved. The dark areas in the center of the bump are believed to be due to residual amounts of trapped adhesive that was not squeezed out of the gap between the bump and corresponding circuit trace during the bonding process.

There was no significant difference in connection stability among the 16 samples at the conclusion of the environmental aging procedure, nor were there any failed connections. All combinations of bond temperature, copper thickness, and PET thickness showed excellent connection stability. Samples with thicker copper showed lower measured resistance values. This difference was completely attributed to the approximately 1.5 squares of extraneous resistance imparted by the copper sheet resistivity. Actual contact resistance was concluded to be the same for all samples in this example.

Figure 13:
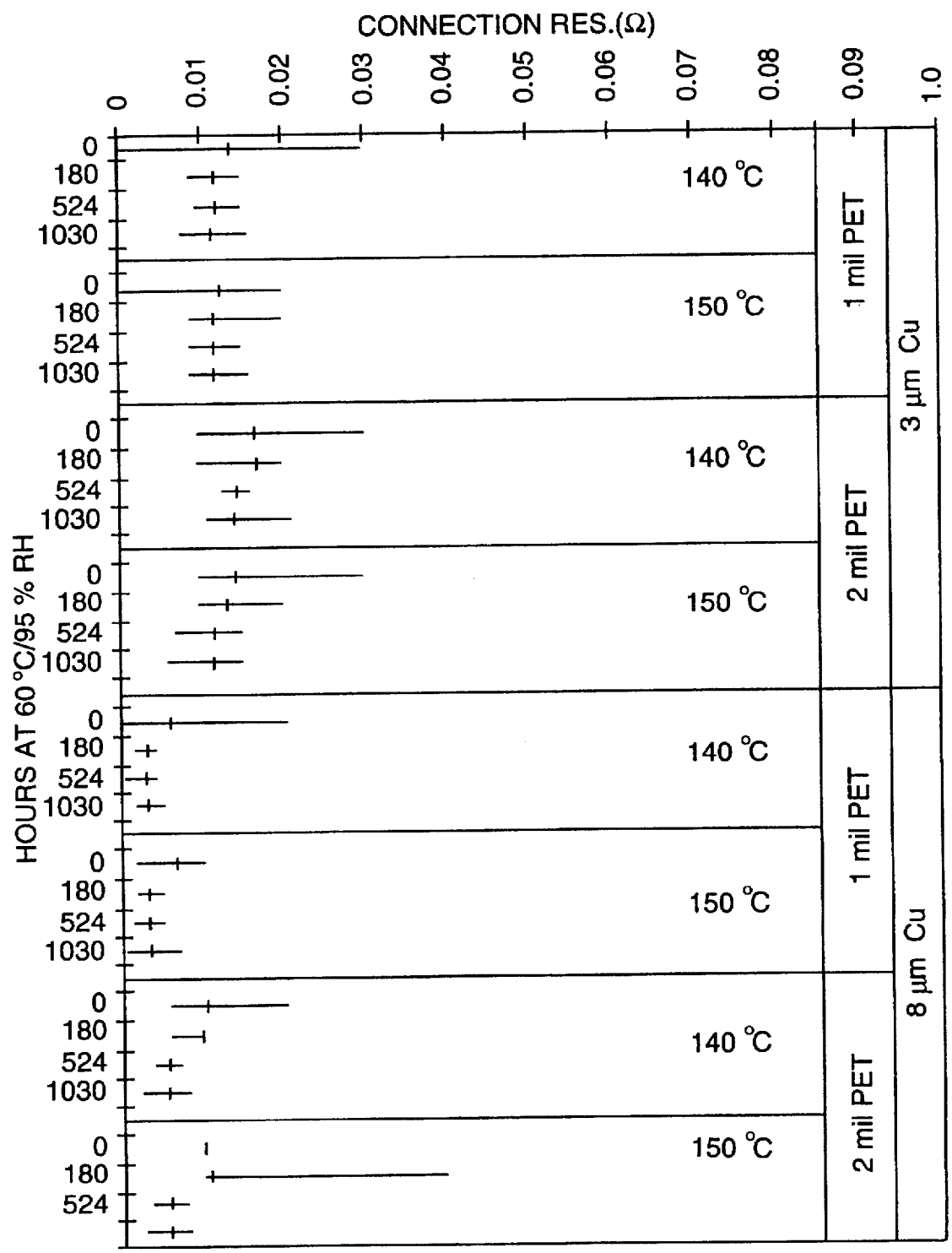
FIG. 13 is a plot of the four probe connection resistance (range and mean) for each of the eight levels of the test matrix of Example 5 as a function of cumulative hours of environmental exposure.

The four probe connection resistance (range and mean) for each of the eight levels of the test matrix as a function of cumulative hours of environmental exposure is shown in FIG. 13.

Example 6

This example demonstrates how bump penetration varies with bond temperature. The samples were prepared using the standard bonding procedure described in Example 1. The substrate used was PET (thickness 25 μm) which was uniformly metallized on one major surface with electroplated copper (thickness 3 μm) which was overcoated with electroplated gold (thickness 750 nm). The adhesive film was omitted.

The bonding conditions used were: temperature (40°–160° C. in 10° C. increments), force (200N), and time (20 seconds).

Thirteen (13) samples were prepared at each of the 13 bonding temperatures (total samples 169). None of the test chips were reused. After bonding, the test chips were removed, and the depth of bump penetration into the substrate was measured using a laser micrometer. Three widely-spaced points outside the perimeter formed by the bump impression were measured with micrometer to establish a reference plane (datum plane). The lowest point (maximum) depth in each depression was chosen as the penetration depth. The depth was measured in two depressions along each side of the chip (8 measurements per sample).

The inter-metallic diffusion bonds formed between the bumps and circuit traces was sufficiently high to tear copper away from the PET at the bottom the bump impressions for bonding temperatures of 130° C. and higher.

Therefore, it was necessary to correct the raw data by subtracting 3 micrometers from the depth measured on samples bonded at, and above, 130° C. The results are shown in Table 2 below.

TABLE 2

| Bond Temp (°C.) | Bump Penetration (μm) | | | Copper-Substrate Delamination? (Yes or No) |
|---|---|---|---|---|
| | min. | mean | max. | |
| 50 | 0.5 | 6 | 11.5 | No |
| 60 | 0.5 | 7 | 13 | No |
| 70 | >0.1 | 6 | 12.5 | No |
| 80 | >0.2 | 3 | 7 | No |
| 90 | 2 | 6 | 11 | No |
| 100 | 2 | 5 | 9 | No |
| 111 | 0.5 | 6 | 12 | No |
| 120 | 3 | 9 | 14 | No |
| 130 | 7 | 12 | 17 | Yes |
| 140 | 2 | 9 | 14 | Yes |
| 150 | 6 | 12 | 15 | Yes |
| 160 | 12 | 13 | 15 | Yes |

The data in Table 2 show that for all bonding temperature below 160° C., the range of bump penetrations is high, of the order of 10 μm peak-to-peak. This indicates poor planarity control in the chip bonder. At temperatures less than 90° C., the minimum bump penetration was less than 1 μm. Therefore, the PET is "hard" and would be unable to accommodate variability in bump height or poor planarity in either chip or substrate, and the like. However, for temperatures of 120° C. and greater, every bump is creating an impression of at least 2 μm in depth. Consequently at temperatures of 120° C. and higher (the approximate $T_g$ for oriented PET films), the PET substrate is readily deformable and appears to be able to easily accommodate several microns of variability in planarity, etc. Based on these results, for best contact, integrity, and reliability, it would certainly appear to be preferable to bond at temperature of 130° C. and above. At these temperatures there is enough strain induced at the bump-substrate interface to easily form diffusion bonds which are quite strong relative to the adhesion of the copper-PET interface as evidenced by the tearing-away of the circuit traces from the underlying substrate.

It will be understood that the exemplary embodiments described herein in no way limit the scope of the invention. Other modifications of the invention will be apparent to those skilled in the art in view of the foregoing description. These descriptions are intended to provide specific examples of embodiments which clearly disclose the present invention. Accordingly, the invention is not limited to the described embodiments or to the use of the specific elements, dimensions, materials or configurations contained therein. All alternative modifications and variations which fall within the spirit and scope of the appended claims are included in the present invention.

We claim:

1. A microelectronic circuit assembly, comprising:

(a) at least one electronic device, wherein said at least one device has at least one protruding bonding site;

(b) a substrate assembly comprising a deformable polymeric substrate having a $T_g$ of less than 200° C. and at least one ductile metal trace on a surface of the substrate, wherein the at least one metal trace has a thickness of about 1 μm to about 10 μm; and (c) an adhesive between the device and the substrate assembly, wherein the protruding bonding sites are in electrical contact with the traces, and said traces extend into the surface of said deformable substrate.

2. A microelectronic circuit assembly as claimed in claim 1, wherein the polymeric material has a $T_g$ of from about 70° C. to about 160° C.

3. A microelectronic circuit assembly as claimed in claim 1, wherein the polymeric material is selected from the group consisting of poly(ethylene terephthalate), poly(ethylene 1,4 napthanate), poly(ethylene 1,5 napthanate), poly(ethylene 2,6-napthanate), poly(ethylene 2,7-napthanate), and syndiotaticpoly(styrene).

4. A microelectronic circuit assembly as claimed in claim 1, wherein the adhesive has at least one of an epoxy group, an acryl group, a silicone group, a butadiene group, a modified acrylate group, and a cyanate ester group.

5. A microelectronic circuit assembly as claimed in claim 1, wherein the adhesive is selected from an epoxy resin, a phenoxy resin and mixtures thereof.

6. A microelectronic circuit assembly as claimed in claim 1, wherein the adhesive further comprises conductive particles.

7. An adhesively bonded microelectronic circuit assembly comprising:

an electronic device with a plurality of metal bumps;

a substrate assembly comprising a deformable polymeric substrate having a thickness of about 10 μm to about 100 μm, a $T_g$ of less than about 200° C., and an arrangement of ductile metal traces on a surface thereof, wherein the metal traces have a thickness of about 1 μm to about 10 μm; and an adhesive layer disposed between said electronic device and said substrate assembly;

wherein the bumps are in electrical contact with the traces, and said traces extend at least about 1 μm into the surface of said deformable substrate.

8. The assembly as claimed in claim 7, wherein said traces extend into the surface of said deformable substrate at least about 2 μm.

9. The assembly as claimed in claim 7, wherein said traces extend into the surface of said deformable substrate at least about 5% of said substrate thickness.

10. The assembly as claimed in claim 7, wherein the polymeric material is selected from the group consisting of poly(ethylene terephthalate), poly(ethylene 1,4 napthanate), poly(ethylene 1,5 napthanate), poly(ethylene 2,6-napthanate), poly(ethylene 2,7-napthanate), and syndiotatic-poly(styrene).

11. The assembly as claimed in claim 7, wherein said adhesive layer further comprises conductive particles.

12. The assembly as claimed in claim 7, wherein said circuit trace ductile metal is selected from the group consisting of copper, gold, silver, aluminum, tin, lead, zinc, and alloys thereof.

* * * * *